(12) United States Patent
Kim et al.

(10) Patent No.: US 11,844,238 B2
(45) Date of Patent: Dec. 12, 2023

(54) DISPLAY DEVICE

(71) Applicant: SAMSUNG DISPLAY CO., LTD., Yongin-si (KR)

(72) Inventors: Jay Bum Kim, Yongin-si (KR); Myeong Ho Kim, Hwaseong-si (KR); Kyoung Seok Son, Seoul (KR); Seung Jun Lee, Suwon-si (KR); Seung Hun Lee, Seoul (KR); Jun Hyung Lim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/735,617

(22) Filed: May 3, 2022

(65) Prior Publication Data

US 2022/0262883 A1 Aug. 18, 2022

Related U.S. Application Data

(62) Division of application No. 16/915,049, filed on Jun. 29, 2020, now Pat. No. 11,329,118.

(30) Foreign Application Priority Data

Oct. 2, 2019 (KR) .......................... 10-2019-0122027

(51) Int. Cl.
*H01L 29/66* (2006.01)
*H10K 59/121* (2023.01)
(Continued)

(52) U.S. Cl.
CPC ....... *H10K 59/1213* (2023.02); *H10K 59/126* (2023.02); *H10K 59/1216* (2023.02);
(Continued)

(58) Field of Classification Search
CPC .......... H10K 59/1213; H10K 59/1216; H10K 59/126; H10K 71/00; H10K 59/1201;
(Continued)

(56) References Cited

U.S. PATENT DOCUMENTS 9,859,391 B2 * 1/2018 Tanaka ................ H01L 29/0847
10,615,235 B2 4/2020 Heo
(Continued)

FOREIGN PATENT DOCUMENTS

KR 10-2007-0072207 A 7/2007

*Primary Examiner* — Tan N Tran
(74) *Attorney, Agent, or Firm* — Lewis Roca Rothgerber Christie LLP

(57) ABSTRACT

A display device includes a substrate, a first semiconductor pattern, a first gate insulating film covering the first semiconductor pattern, a first conductive layer and a second semiconductor pattern are on the first gate insulating film, a second gate insulating film on the second semiconductor pattern, a third gate insulating film covering the first gate insulating film and the second gate insulating film, a second conductive layer on the third gate insulating film, an interlayer insulating film covering the second conductive layer, and a third conductive layer on the interlayer insulating film, wherein the first and second semiconductor patterns respectively form semiconductor layers of the first and second transistors, wherein the first conductive layer includes a gate electrode of the first transistor and a first electrode of the capacitor, and wherein the second conductive layer includes a gate electrode of the second transistor and a second electrode of the capacitor.

4 Claims, 24 Drawing Sheets

(51) Int. Cl.
    *H10K 59/126*    (2023.01)
    *H10K 71/00*    (2023.01)
    *H01L 27/12*    (2006.01)
    *H01L 29/423*    (2006.01)
    *H01L 29/49*    (2006.01)
    *H01L 29/786*    (2006.01)
    *H10K 59/12*    (2023.01)

(52) U.S. Cl.
    CPC .......... *H10K 71/00* (2023.02); *H01L 27/1225* (2013.01); *H01L 27/1237* (2013.01); *H01L 27/1251* (2013.01); *H01L 27/1255* (2013.01); *H01L 27/1288* (2013.01); *H01L 29/42384* (2013.01); *H01L 29/4908* (2013.01); *H01L 29/66757* (2013.01); *H01L 29/66969* (2013.01); *H01L 29/7869* (2013.01); *H01L 29/78633* (2013.01); *H01L 29/78675* (2013.01); *H10K 59/1201* (2023.02)

(58) Field of Classification Search
    CPC .... H10K 59/123; H10K 59/124; H10K 59/12; H10K 59/131; H10K 59/35; H01L 27/1225; H01L 27/1237; H01L 27/1251; H01L 27/1255; H01L 27/1288; H01L 29/42384; H01L 29/4908; H01L 29/66757; H01L 29/66969; H01L 29/78633; H01L 29/78675; H01L 29/7869; H01L 27/1214; H01L 29/786; H01L 51/56; H01L 2227/323; H01L 27/3276; H01L 27/3244; H01L 27/3272; H01L 27/3262; H01L 27/3258; H01L 27/3248; H01L 27/3265; H01L 27/3211
    USPC ..................................... 257/59, 72
    See application file for complete search history.

(56) References Cited

U.S. PATENT DOCUMENTS

| | | |
|---|---|---|
| 2013/0092927 A1 | 4/2013 | Murai et al. |
| 2016/0035997 A1 | 2/2016 | Oh |
| 2019/0288048 A1* | 9/2019 | Kang .................. G09G 3/3233 |

* cited by examiner

Fig. 2
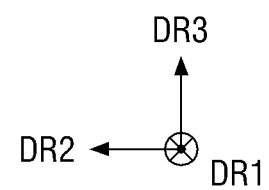

DISPLAY DEVICE

CROSS-REFERENCE TO RELATED APPLICATIONS

This application is a divisional of U.S. patent application Ser. No. 16/915,049, filed Jun. 29, 2020, which claims priority to and the benefit of Korean Patent Application No. 10-2019-0122027, filed Oct. 2, 2019, the entire content of both of which is incorporated herein by reference.

BACKGROUND

1. Field

Aspects of the present disclosure relate to a display device.

2. Description of the Related Art

Display devices are becoming increasingly important with the development of multimedia. In response to this, various types of display devices such as liquid crystal displays (LCDs), organic light-emitting diode (OLED) displays, and the like are in use. The OLED display displays an image using OLEDs that generate light by recombining electrons and holes. The OLED display includes a plurality of transistors that provide a driving current to the OLED.

SUMMARY

Aspects of embodiments of the present disclosure are directed to a display device in which the number of masks used in a manufacturing process is reduced.

Aspects of embodiments of the present disclosure are also directed to a method of manufacturing a display device in which the number of masks used in a manufacturing process is reduced.

The scope of the present disclosure is not limited to the above-described aspects, and other unmentioned aspects may be clearly understood by those skilled in the art from the following description.

According to some embodiments of the present invention, there is provided a display device including a first transistor having a channel, a second transistor having a channel, and a capacitor, in which the channels are formed of different semiconductor layers, the display device further including: a substrate; a first semiconductor pattern on the substrate; a first gate insulating film covering the first semiconductor pattern; a first conductive layer and a second semiconductor pattern are on the first gate insulating film; a second gate insulating film on the second semiconductor pattern; a third gate insulating film covering the first gate insulating film and the second gate insulating film; a second conductive layer on the third gate insulating film; an interlayer insulating film covering the second conductive layer; and a third conductive layer on the interlayer insulating film, wherein the first semiconductor pattern forms a semiconductor layer of the first transistor, wherein the second semiconductor pattern forms a semiconductor layer of the second transistor, and a side surface of the second semiconductor pattern is aligned with a side surface of the second gate insulating film, wherein the first conductive layer includes a gate electrode of the first transistor and a first electrode of the capacitor, wherein the second conductive layer includes a gate electrode of the second transistor and a second electrode of the capacitor, and wherein the third conductive layer includes a source/drain electrode of the first transistor and a source/drain electrode of the second transistor.

In some embodiments, the PMOS transistor includes polycrystalline silicon, and the NMOS transistor includes an oxide semiconductor.

In some embodiments, the display device further includes a capping film covering the first conductive layer, wherein the capping film is interposed between the first gate insulating film and the second semiconductor pattern and between the gate electrode of the first transistor and the third gate insulating film.

In some embodiments, the capping film includes silicon oxide.

In some embodiments, a thickness of the capping film is smaller than a thickness of the second gate insulating film.

In some embodiments, the second gate insulating film is between the second semiconductor pattern and the gate electrode of the second transistor, and is not between the first electrode of the capacitor and the second electrode of the capacitor.

In some embodiments, the second gate insulating film includes silicon oxide, and the third gate insulating film includes silicon nitride.

In some embodiments, the gate electrode of the first transistor and the semiconductor layer of the second transistor are formed at a same layer.

In some embodiments, an insulating film, which is a same as an insulating film between the gate electrode of the first transistor and the second electrode of the capacitor, is between the semiconductor layer of the second transistor and the gate electrode of the second transistor.

In some embodiments, a distance between the gate electrode of the second transistor and the semiconductor layer of the second transistor is greater than a distance between the first electrode of the capacitor and the second electrode of the capacitor.

In some embodiments, a thickness of the second gate insulating film is greater than a thickness of the third gate insulating film.

According to some embodiments of the present invention, there is provided a display device including: a first transistor including a non-oxide semiconductor layer forming a non-oxide semiconductor pattern; a second transistor including an oxide semiconductor layer forming an oxide semiconductor pattern; a first gate insulating film on the oxide semiconductor layer; and a capacitor, wherein a first electrode of the capacitor and a gate electrode of the first transistor are formed of a same first conductive layer, wherein a gate electrode of the second transistor and a second electrode of the capacitor are formed of a second conductive layer different from the first conductive layer, wherein a source/drain electrode of the first transistor and a source/drain electrode of the second transistor are formed of a third conductive layer different from the first conductive layer and the second conductive layer, and wherein a side surface of the oxide semiconductor pattern is aligned with a side surface of the first gate insulating film.

In some embodiments, one of the first transistor and the second transistor is a p-type metal-oxide-semiconductor (PMOS) transistor, and an other one is an n-type metal-oxide-semiconductor (NMOS) transistor.

In some embodiments, the display device further includes: a capping film covering the gate electrode of the first transistor; and a second gate insulating film on the capping film, wherein the capping film is below the oxide semiconductor pattern, and the second gate insulating film covers the first gate insulating film.

In some embodiments, the first gate insulating film includes silicon oxide, and the second gate insulating film includes silicon nitride.

According to some embodiments of the present invention, there is provided a method of manufacturing a display device including a first transistor having a channel, a second transistor having a channel, and a capacitor, in which the channels are formed of different semiconductor layers, the method including: forming a first semiconductor pattern on a substrate; forming a first gate insulating film covering the first semiconductor pattern; forming a first conductive layer on the first gate insulating film; forming a material layer for a second semiconductor layer on the first gate insulating film; forming a material layer for a second gate insulating film on the material layer for the second semiconductor layer; sequentially etching the material layer for the second gate insulating film and the material layer for the second semiconductor layer using a same etching mask and forming a second semiconductor pattern and a second gate insulating film on the second semiconductor pattern; forming a third gate insulating film covering the second gate insulating film; and forming a second conductive layer on the third gate insulating film, wherein the first semiconductor pattern forms a semiconductor layer of the first transistor, wherein the second semiconductor pattern forms a semiconductor layer of the second transistor, and a side surface of the second semiconductor pattern is aligned with a side surface of the second gate insulating film, wherein the first conductive layer includes a gate electrode of the first transistor and a first electrode of the capacitor, and wherein the second conductive layer includes a gate electrode of the second transistor and a second electrode of the capacitor.

In some embodiments, the second gate insulating film includes silicon oxide, and the third gate insulating film includes silicon nitride.

In some embodiments, the second gate insulating film is between the second semiconductor pattern and the gate electrode of the second transistor, and is not between the first electrode of the capacitor and the second electrode of the capacitor.

In some embodiments, the method further includes forming a capping film covering the first conductive layer, wherein the capping film is interposed between the first gate insulating film and the second semiconductor pattern and between the gate electrode of the first transistor and the third gate insulating film.

Thus, according to some embodiments, the number of masks used in the manufacture of the display device can be reduced, thereby reducing process costs and increasing process efficiency.

Other aspects, features, and characteristics that are not described above will be more clearly understood from the accompanying drawings, claims, and detailed description.

BRIEF DESCRIPTION OF THE DRAWINGS

The above and other aspects and features of the present disclosure will become more apparent by describing exemplary embodiments thereof in detail with reference to the attached drawings, in which:

FIG. 2 is a side view of the display device of FIG. 1 in a bent state;

DETAILED DESCRIPTION

Figure 1:
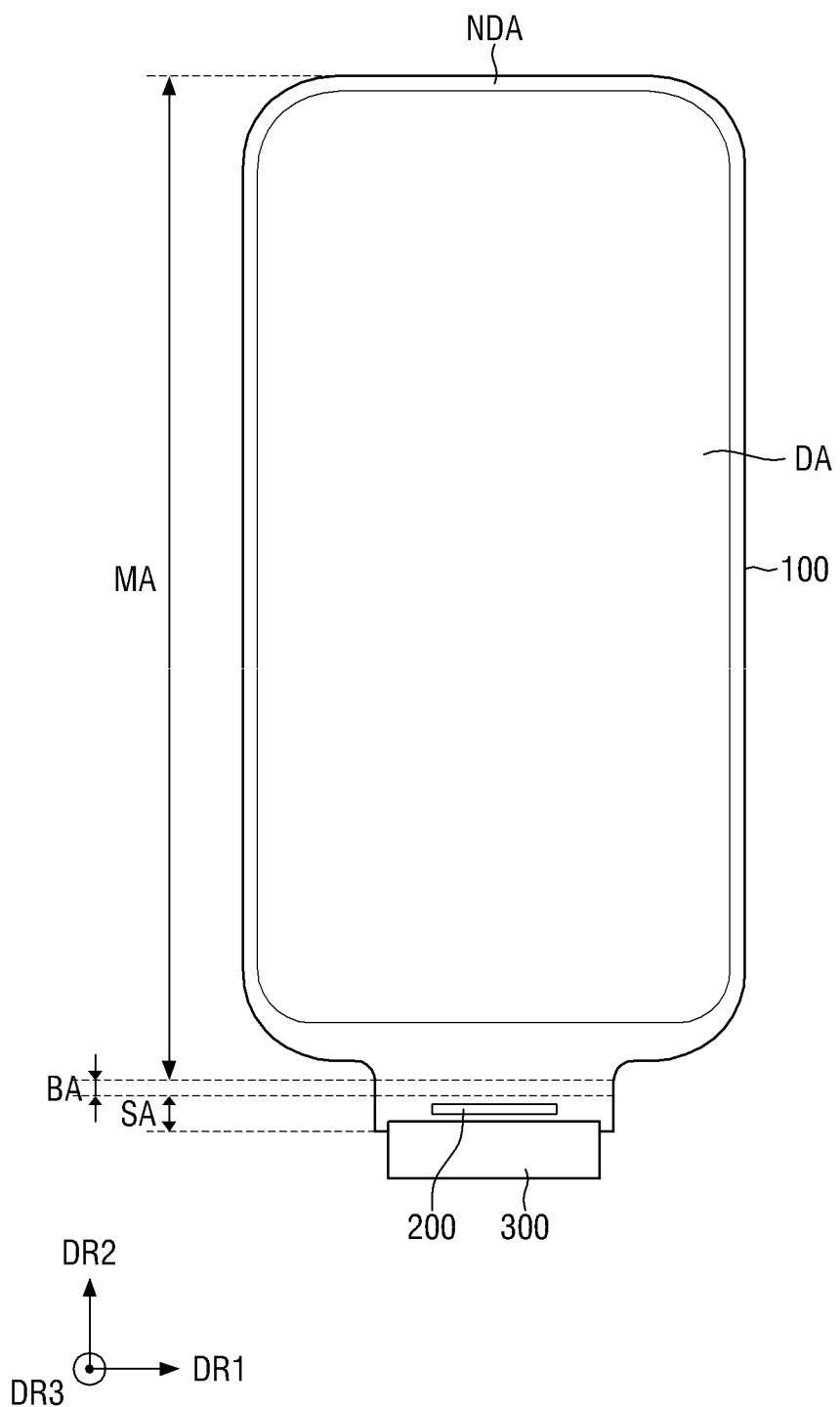
FIG. 1 is a plan view of a display device according to an example embodiment.

The present invention will now be described more fully hereinafter with reference to the accompanying drawings, in which example embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification. In the attached figures, the thickness of layers and regions is exaggerated for clarity.

Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ.

Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on," "directly connected to", "directly coupled to", or "immediately adjacent" another element or layer, there are no intervening elements or layers present.

As used herein, the term "substantially," "about," and similar terms are used as terms of approximation and not as terms of degree, and are intended to account for the inherent variations in measured or calculated values that would be recognized by those of ordinary skill in the art.

As used herein, the terms "use," "using," and "used" may be considered synonymous with the terms "utilize," "utilizing," and "utilized," respectively.

Those skilled in the art will appreciate that many variations and modifications can be made to the example embodiments without substantially departing from the principles of the present invention. Therefore, the disclosed example embodiments of the invention are used in a generic and descriptive sense and not for purposes of limitation.

Hereinafter, example embodiments will be described with reference to the accompanying drawings.

FIG. 1 is a plan view of a display device according to an embodiment. FIG. 2 is a side view of the display device of FIG. 1. FIG. 2 illustrates a shape of a side surface of the display device which is bent in a thickness direction thereof.

A display device 1 may be a device for displaying moving images or still images, and the display device 1 may be used as display screens of portable electronic devices, such as mobile phones, smart phones, tablet personal computers (PCs), smart watches, watch phones, mobile communication terminals, electronic notebooks, e-book readers, portable multimedia players (PMPs), navigation systems, and ultra-mobile PCs (UMPCs), and may be used as display screens of various products such as televisions, laptop computers, monitors, billboards, and internet of things (IOT) devices.

The display device 1 according to the embodiment may have a substantially rectangular shape in the plan view. The display device 1 may have a rectangular shape of which corners are a right angle in the plan view. However, embodiments of the present disclosure are not limited thereto, and the display device 1 may have a rectangular shape of which corners are rounded in the plan view. While the display device 1 is illustrated in FIG. 1 as being substantially rectangular, embodiments of the present disclosure are not limited thereto, and the display device 1 may have any suitable shape known to those skilled in the art.

In the drawings, a first direction DR1 represents a lateral direction of the display device 1 in the plan view and a second direction DR2 represents a longitudinal direction of the display device 1 in the plan view. In addition, a third direction DR3 represents the thickness direction of the display device 1. The first direction DR1 and the second direction DR2 cross each other perpendicularly, and the third direction DR3 is a direction crossing a plane in which the first direction DR1 and the second direction DR2 are placed and crosses the plane to be perpendicular to both of the first direction DR1 and the second direction DR2. That is, the first through third directions D1-D3 may all be orthogonal to one another. However, directions to be described with reference to embodiments should be understood to refer to relative directions and the embodiments are not limited to the described directions.

Unless otherwise defined, in this specification, the term "upper portion," "upper surface," or "upper side" represented with respect to the third direction DR3 refers to a side of a display surface with respect to a display panel 100, and the term "lower portion," "lower surface," or "lower side" refers to an opposite side of the display surface with respect to the display panel 100.

Referring to FIGS. 1 and 2, the display device 1 may include the display panel 100. The display panel 100 may be a flexible substrate including a flexible polymer material such as polyimide and/or the like. Accordingly, the display panel 100 may be flexible, bendable, foldable, and/or rollable.

The display panel 100 may be an organic light-emitting display panel. In the following embodiment, an example in which an organic light-emitting display panel is applied as the display panel 100 is illustrated; however, embodiments of the present disclosure are not limited thereto, and other types of display panels, such as liquid crystal display (LCD) panels, quantum-dot organic light-emitting diode (QD-OLED) display panels, quantum-dot LCD (QD-LCD) panels, quantum nano light-emitting display panels (e.g., nano-emissive display (NED) panels), micro LED display panels, and/or the like may be applied as the display panel 100.

The display panel 100 may include a display region DA in which a is displayed and a non-display region NDA in which the screen is not displayed. For example, the display region DA may be the only region capable of displaying an image, and the non-display region NDA may not be capable of displaying any image. The display panel 100 may be divided into the display region DA and the non-display region NDA in the plan view. The non-display region NDA may be disposed to surround (or be around) the display region DA. The non-display region NDA may form a bezel of the display panel 100.

The display region DA may have a rectangular shape of which corners are a right angle in the plan view or may be a substantially rectangular shape of which corners are rounded in the plan view. The display region DA may have short sides and long sides. The short sides of the display region DA may be sides extending in the first direction DR1. The long sides of the display region DA may be sides extending in the second direction DR2. However, a planar shape of the display region DA is not limited to the rectangular shape, and may be a circular or elliptical shape, or various other shapes.

The display region DA may include a plurality of pixels. The pixels may be arranged in a matrix form. Each of the pixels may include a light-emitting layer and a circuit layer which controls a light emission amount (e.g., intensity) of the light-emitting layer. The circuit layer may include a line, an electrode, and at least one transistor. The light-emitting layer may include an organic light-emitting material. The light-emitting layer may be sealed (e.g., sealed from the outside) by an encapsulation film. An example configuration of the pixel will be described below.

The non-display region NDA may be disposed adjacent to two short sides and two long sides of the display region DA. In this case, the non-display region NDA may surround (or be around) all the sides of the display region DA and form an edge of the display region DA. However, embodiments of the present disclosure are not limited thereto, and the non-display region NDA may be disposed adjacent to only two short sides or two long sides of the display region DA.

The display panel 100 may include a main region MA and a bending region BA connected to one side of the main region MA in the second direction DR2. The display panel 100 may further include a subregion SA of which one side is connected to the bending region BA in the second direction DR2 and which is bent in the thickness direction thereof (e.g., the third direction DR3) to overlap the main region MA in the thickness direction.

The display region DA may be located in the main region MA. The non-display region NDA may be located at a peripheral edge portion of the display region DA of the main region MA.

The main region MA may have a shape similar to that of an exterior of the display device 1 in the plan view. The main region MA may be a flat region located on one surface. However, embodiments of the present disclosure are not limited thereto, and at least one of the remaining edges except for the edge (e.g., side) of the main region MA connected to the bending region BA may be curved to form a curved surface or may be bent in a vertical direction.

When at least one of the remaining edges except for the edge (e.g., side) of the main region MA connected to the bending region BA is curved or bent, the display region DA may also be disposed at the corresponding edge. However, embodiments of the present disclosure are not limited thereto, and the non-display region NDA in which the screen is not displayed may be disposed at the curved or bent edge, or the display region DA and the non-display region NDA may be disposed together at the curved or bent edge.

The non-display region NDA of the main region MA may be placed on a region extending from an outer boundary of the display region DA to the edge of the display panel 100. Signal lines for applying signals to the display region DA or driving circuits may be disposed in the non-display region NDA of the main region MA.

The bending region BA may be connected to one short side of the main region MA. A width (e.g., a width in the first direction DR1) of the bending region BA may be smaller than a width (a width of the short side) of the main region MA. A connection portion between the main region MA and the bending region BA may have an L-shaped cut shape in order to reduce a width of a bezel.

In the bending region BA, the display panel 100 may be bent with a curvature in a direction opposite to a direction of a display surface thereof. When the display panel 100 is bent in the bending region BA, a surface of the display panel 100 may be reversed. That is, one surface of the display panel 100 facing upward may face an outer side of a side surface of the display panel 100 through the bending region BA and then may be changed (e.g., bent) to face downward.

The subregion SA extends from the bending region BA. The subregion SA may extend from a bending end point in a direction parallel to the main region MA. The subregion SA may overlap the main region MA in the thickness direction of the display panel 100. The subregion SA may overlap the non-display region NDA at the edge of the main region MA and may further overlap the display region DA of the main region MA. A width of the subregion SA may be identical to the width of the bending region BA; however, embodiments of the present disclosure are not limited thereto and a width of the subregion SA may be different from the width of the bending region BA.

Pad portions may be disposed on the subregion SA of the display panel 100. External devices may be mounted on (or attached to) the pad portions. Examples of the external device may include a driving chip 200, a driving substrate 300 formed as a flexible printed board or a rigid printed board, and/or the like. In addition, a line connection film, a connector, and/or the like may be mounted on the pad portions as the external devices. One or more external devices may be mounted in the subregion SA. For example, as illustrated in FIGS. 1 and 2, the driving chip 200 may be disposed in the subregion SA of the display panel 100, and the driving substrate 300 may be attached to an end portion of the subregion SA. In this case, the display panel 100 may include both of a pad portion connected to the driving chip 200 and a pad portion connected to the driving substrate 300. As another example, a driving chip may be mounted on a film and the film may be attached to the subregion SA of the display panel 100.

The driving chip 200 may be mounted on one surface, which is coplanar with the display surface of the display panel 100, of the display panel 100. As described above, due to the bending region BA being bent and reversed, the driving chip 200 may be mounted on the surface of the display panel 100 facing downward in the thickness direction and thus an upper surface of the driving chip 200 may face downward.

The driving chip 200 may be attached to the display panel 100 using an anisotropic conductive film or may be attached to the display panel 100 by ultrasonic bonding. However, embodiments of the present disclosure are not limited thereto, and the driving chip 200 may be attached to the display panel 100 by any suitable form of bonding. A lateral width of the driving chip 200 may be smaller than a lateral width of the display panel 100. The driving chip 200 may be disposed on a central portion of the subregion SA in a lateral direction (the first direction DR1), and left and right edges of the driving chip 200 may be spaced apart from left and right edges of the subregion SA, respectively.

The driving chip 200 may include an integrated circuit that drives the display panel 100. In an embodiment, the integrated circuit may be a data driving integrated circuit that generates and provides a data signal; however, embodiments of the present disclosure are not limited thereto. The driving chip 200 is connected to line pads provided on the pad portions of the display panel 100 to provide data signals to the line pads. The lines connected to the line pads extend to the pixels to apply the data signals to the respective pixels.

Figure 3:
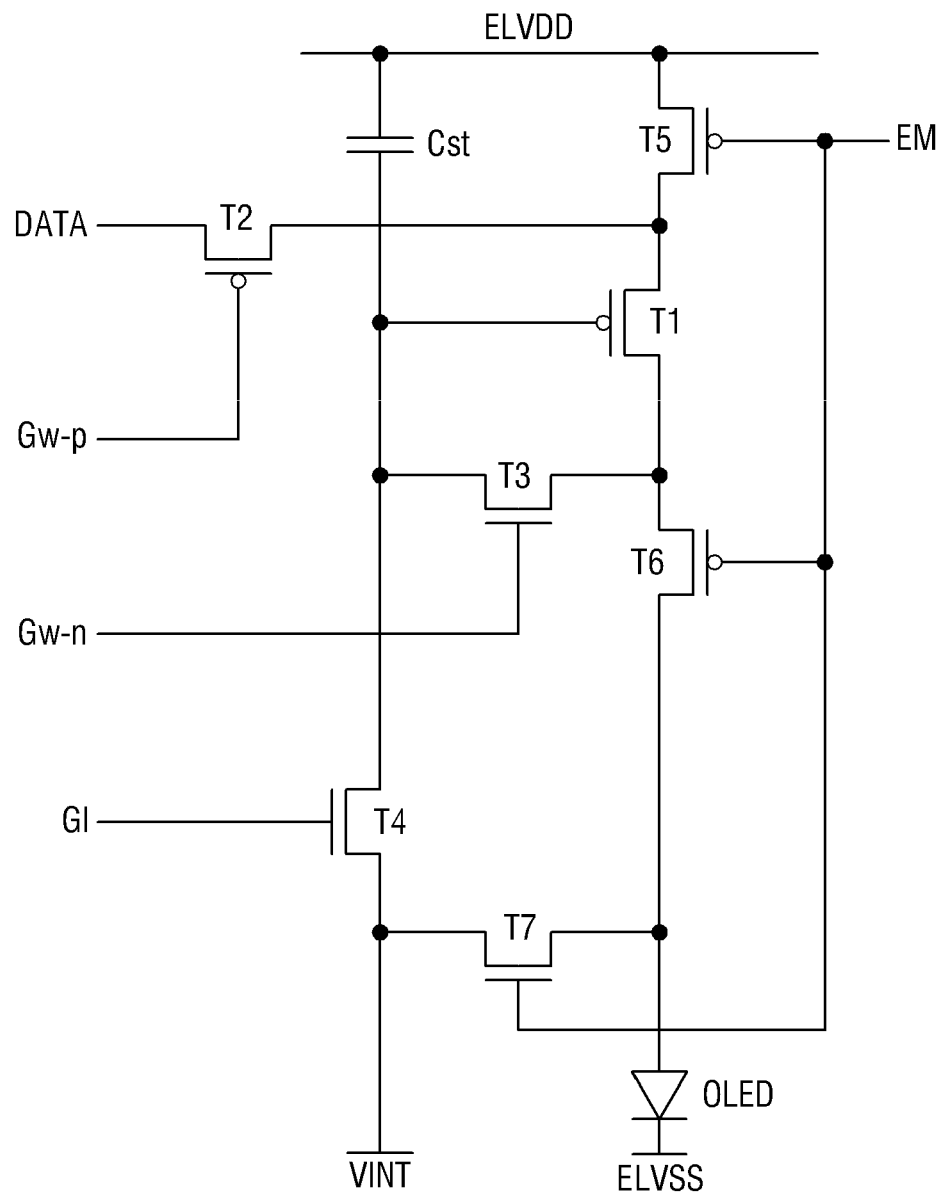
FIG. 3 is an equivalent circuit diagram of one pixel of a display device according to an example embodiment.

FIG. 3 is an equivalent circuit diagram of on pixel of a display device according to an embodiment.

Referring to FIG. 3, a circuit of one pixel of an organic light-emitting display device includes an organic light-emitting diode OLED, a plurality of transistors T1 to T7, and a capacitor Cst. A data signal DATA, a first scan signal Gw-p, a second scan signal Gw-n, a third scan signal GI, a light-emitting control signal EM, a first power voltage ELVDD, a second power voltage ELVSS, and an initialization voltage VINT are applied to the circuit of the pixel.

The organic light-emitting diode OLED includes an anode electrode and a cathode electrode. The capacitor Cst includes a first electrode and a second electrode.

The plurality of transistors may include first to seventh transistors T1 to T7. Each of the transistors T1 to T7 includes a gate electrode, a first source/drain electrode, and a second source/drain electrode. Any one of the first and second source/drain electrodes of each of the transistors T1 to T7 may be a source electrode, and the other one may be a drain electrode.

Each of the transistors T1 to T7 may be a thin film transistor. Each of the transistors T1 to T7 may be any one of a p-type metal-oxide-semiconductor (PMOS) transistor and an n-type metal-oxide-semiconductor (NMOS) transistor. In an embodiment, a first transistor T1 serving as a driving transistor, a second transistor T2 serving as a data transfer transistor, a fifth transistor T5 serving as a first light-emitting control transistor, and a sixth transistor T6 serving as a second light-emitting control transistor are PMOS transistors. On the other hand, a third transistor T3 serving as a compensation transistor, a fourth transistor T4 serving as a first initialization transistor, and a seventh transistor T7 serving as a second initialization transistor may be NMOS transistors. The PMOS transistor and the NMOS transistor may have different characteristics. The third transistor T3, the fourth transistor T4, and the seventh transistor T7 may be formed as NMOS transistors having relatively high turn-off characteristics, and thus a leakage of a driving current Id during an emission period of the organic light-emitting diode OLED may be reduced.

Hereinafter, each component will be described in further detail.

The gate electrode of the first transistor T1 is connected to the first electrode of the capacitor Cst. The first source/drain electrode of the first transistor T1 is connected to a terminal of the first power voltage ELVDD (i.e., the terminal configured to receive the first power voltage ELVDD) via the fifth transistor T5. The second source/drain electrode of the first transistor T1 is connected to the anode electrode of the organic light-emitting diode OLED via the sixth transistor T6. The first transistor T1 receives the data signal DATA according to a switching operation of the second transistor T2 and supplies the driving current Id to the organic light-emitting diode OLED.

The gate electrode of the second transistor T2 is connected to a terminal of the first scan signal Gw-p (i.e., the terminal configured to receive the first scan signal Gw-p). The first source/drain electrode of the second transistor T2 is connected to a terminal of the data signal DATA (i.e., the terminal configured to receive the data signal DATA). The second source/drain electrode of the second transistor T2 is connected to the terminal of the first power voltage ELVDD via the fifth transistor T5 and is connected to the first source/drain electrode of the first transistor T1. The second transistor T2 is turned on according to the first scan signal Gw-p to perform the switching operation in which the data signal DATA is transmitted to the first source/drain electrode of the first transistor T1.

The gate electrode of the third transistor T3 is connected to a terminal of the second scan signal Gw-n (i.e., the terminal configured to receive the second scan signal Gw-n). The first source/drain electrode of the third transistor T3 is connected to the anode electrode of the organic light-emitting diode OLED via the sixth transistor T6 and is connected to the second source/drain electrode of the first transistor T1. The second source/drain electrode of the third transistor T3 is connected to the first electrode of the capacitor Cst, the first source/drain electrode of the fourth transistor T4, and the gate electrode of the first transistor T1. The third transistor T3 is turned on according to the second scan signal Gw-p to connect the gate electrode of the first transistor T1 to the second source/drain electrode and diode-connect the first transistor T1. Accordingly, a voltage difference is generated between the first source/drain electrode of the first transistor T1 and the gate electrode by a threshold voltage of the first transistor T1. Therefore, the data signal DATA for which the threshold voltage is compensated may be supplied to the gate electrode of the first transistor T1 so that a deviation/variation of the threshold voltage of the first transistor T1 may be compensated for.

The gate electrode of the fourth transistor T4 is connected to a terminal of the third scan signal GI (i.e., the terminal configured to receive the third scan signal GI). The second source/drain electrode of the fourth transistor T4 is connected to a terminal of the initialization voltage VINT (i.e., the terminal configured to receive the initialization voltage VINT). The first source/drain electrode of the fourth transistor T4 is connected to the first electrode of the capacitor Cst, the second source/drain electrode of the third transistor T3, and the gate electrode of the first transistor T1. The fourth transistor T4 is turned on according to the third scan signal GI to perform an operation in which the initialization voltage VINT is transmitted to the gate electrode of the first transistor T1 so that a voltage of the gate electrode of the first transistor T1 is initialized.

The gate electrode of the fifth transistor T5 is connected to a terminal of the light-emitting control signal EM (i.e., the terminal configured to receive the light-emitting control signal EM). The first source/drain electrode of the fifth transistor T5 is connected to the terminal of the first power voltage ELVDD. The second source/drain electrode of the fifth transistor T5 is connected to the first source/drain electrode of the first transistor T1 and the second source/drain electrode of the second transistor T2.

The gate electrode of the sixth transistor T6 is connected to the terminal of the light-emitting control signal EM. The first source/drain electrode of the sixth transistor T6 is connected to the second source/drain electrode of the first transistor T1 and the first source/drain electrode of the third transistor T3. The second source/drain electrode of the sixth transistor T6 is connected to the anode electrode of the organic light-emitting diode OLED.

The fifth transistor T5 and the sixth transistor T6 are turned on concurrently (e.g., simultaneously) according to the light-emitting control signal EM so that the driving current Id flows into the organic light-emitting diode OLED.

The gate electrode of the seventh transistor T7 is connected to the terminal of the light-emitting control signal EM. The first source/drain electrode of the seventh transistor T7 is connected to the anode electrode of the organic light-emitting diode OLED. The second source/drain electrode of the seventh transistor T7 is connected to the terminal of the initialization voltage VINT. The seventh transistor T7 is turned on according to the light-emitting control signal EM to initialize the anode electrode of the organic light-emitting diode OLED.

The seventh transistor T7 receives the same light-emitting control signal EM as the fifth transistor T5 and the sixth transistor T6. However, because the seventh transistor T7 is the NMOS transistor and the fifth transistor T5 and the sixth transistor T6 are the PMOS transistors, the seventh transistor T7 may be turned on at a different timing (e.g., different time) from the fifth transistor T5 and the sixth transistor T6. That is, when the light-emitting control signal EM is a high level, the seventh transistor T7 is turned on and the fifth transistor T5 and the sixth transistor T6 are turned off. When the light-emitting control signal EM is a low level, the seventh transistor T7 is turned off and the fifth transistor T5 and the sixth transistor T6 are turned on. Therefore, the initialization operation by the seventh transistor T7 may not be performed at an emission time point at which the fifth transistor T5 and the sixth transistor T6 are turned on, and the initialization by the seventh transistor T7 may be performed at a non-emission time point at which the fifth transistor T5 and the sixth transistor T6 are turned off.

In the present embodiment, an example in which the gate electrode of the seventh transistor T7 receives the light-emitting control signal EM is illustrated. However, as another example, the circuit of the pixel may be configured such that the gate electrode of the seventh transistor T7 receives the third scan signal GI.

The second electrode of the capacitor Cst is connected to the terminal of the first power voltage ELVDD. The first electrode of the capacitor Cst is connected to the gate electrode of the first transistor T1, the second source/drain electrode of the third transistor T3, and the first source/drain electrode of the fourth transistor T4. The cathode electrode of the organic light-emitting diode OLED is connected to the terminal of the second power voltage ELVSS (i.e., the terminal configured to receive the second power voltage ELVSS). The organic light-emitting diode OLED receives the driving current Id from the first transistor T1 and emits light to display an image.

Figure 4:
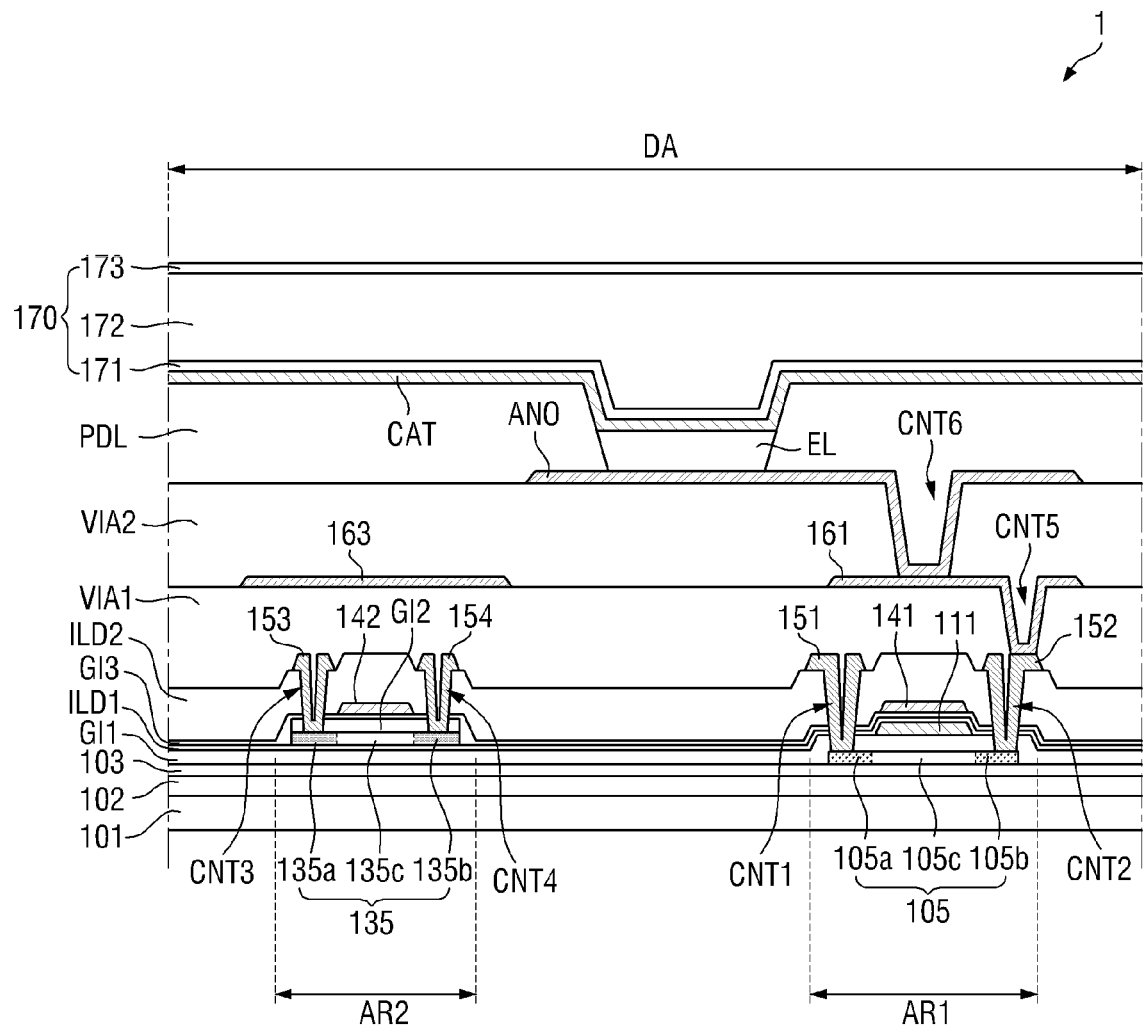
FIG. 4 is a cross-sectional view illustrating an exemplary cross section of one pixel of a display device according to an example embodiment.

Hereinafter, a cross-sectional structure of a display panel 100 will be described in detail with reference to FIG. 4. FIG. 4 illustrates an example of a cross-sectional structure of one pixel of a display region DA of the display panel 100 and a non-display region NDA including a bending region BA.

FIG. 4 is a cross-sectional view illustrating an exemplary cross section of one pixel of a display region.

The display region DA of the display panel 100 will be described with reference to FIG. 4.

The display region DA may include a silicon transistor region AR1 in which a non-oxide inorganic semiconductor transistor (hereinafter, referred to as "a silicon transistor") including polycrystalline silicon serving as a channel is disposed, and an oxide transistor region AR2 in which an oxide semiconductor transistor (hereinafter, referred to as "an oxide transistor") including an oxide semiconductor serving as a channel is disposed. The silicon transistor disposed in the silicon transistor region AR1 may be a PMOS transistor, and in FIG. 4, a first transistor T1 serving as a driving transistor is illustrated as an example of the silicon transistor. The oxide transistor disposed in the oxide transistor region AR2 may be an NMOS transistor, and in FIG. 4, a third transistor T3 serving as a compensation transistor is illustrated as an example of the oxide transistor.

A second transistor T2, a fifth transistor T5, and a sixth transistor T6, which are other silicon transistors disposed in the silicon transistor region AR1, may have substantially the same stacked structure as the first transistor T1, and a fourth transistor T4 and a seventh transistor T7, which are other oxide transistors disposed in the oxide transistor region AR2, may have substantially the same stacked structure as the third transistor T3. Detailed descriptions of the silicon transistor and the oxide transistor will be provided below.

In the display region DA of the display panel 100, a base substrate 101, a barrier layer 102, a buffer layer 103, a silicon semiconductor pattern PS including a silicon semiconductor layer 105, a first gate insulating film GI1, a first conductive layer 110, a capping film ILD1, an oxide semiconductor pattern PO including an oxide semiconductor layer 135, a second gate insulating film GI2, a third gate insulating film GI3, a second conductive layer 140, an interlayer insulating film ILD2, a third conductive layer 150, a first via layer VIA1, a fourth conductive layer 160, a second via layer VIA2, a pixel electrode ANO, and a pixel definition film PDL may be sequentially disposed. Each of the above-described layers may be formed as a single film or may be formed as a stacked film including a plurality of films. Another layer may be further disposed between the above-mentioned layers.

The base substrate 101 supports the respective layers disposed thereabove. The base substrate 101 may include, for example, an insulating material such as a polymer resin and/or the like. Examples of the polymer material may include polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), or a combination thereof. The base substrate 101 may include a metal material.

The base substrate 101 may be a flexible substrate that is bendable, foldable, and/or rollable. An example of the material forming the flexible substrate may include PI; however, embodiments of the present disclosure are not limited thereto and any suitable material may be used to form the flexible substrate.

When an organic light-emitting display device is a backside or double-sided emission type, a transparent substrate may be used. When the organic light-emitting display device is a top emission type, not only a transparent substrate but also a translucent or opaque substrate may be used.

The barrier layer 102 may be disposed on the base substrate 101. The barrier layer 102 may prevent or substantially reduce the diffusion of impurity ions, prevent or substantially reduce the penetration of moisture or external air, and perform a surface planarization function. The barrier layer 102 may include silicon nitride, silicon oxide, silicon oxynitride, and/or the like. The barrier layer 102 may be omitted according to a type of the base substrate 101, process conditions, and/or the like.

The buffer layer 103 may be disposed on the barrier layer 102. The buffer layer 103 may include at least one of silicon nitride, silicon oxide, and silicon oxynitride, and/or the like. The buffer layer 103 may be omitted according to the type of the base substrate 101, the process conditions, and/or the like.

The silicon semiconductor pattern PS may be disposed on the buffer layer 103. The silicon semiconductor pattern PS may include polycrystalline silicon, single crystalline silicon, amorphous silicon, and/or the like.

The silicon semiconductor pattern PS may include the silicon semiconductor layer 105. The silicon semiconductor layer 105 may include polycrystalline silicon. In this case, the polycrystalline silicon may be formed by crystallizing amorphous silicon using a crystallization method, such as a rapid thermal annealing (RTA) method, a solid phase crystallization (SPC) method, an excimer laser annealing (ELA) method, a metal induced crystallization (MIC) method, a metal induced lateral crystallization (MILC) method, a sequential lateral solidification (SLS) method, and/or the like.

The silicon semiconductor layer 105 may include a channel region 105c, which is disposed to overlap a first gate electrode 111 thereabove in the thickness direction thereof, and a first source/drain region 105a and a second source/drain region 105b, which are respectively located on one side and the other side of the channel region 105c (e.g., located at opposite sides of the channel region 105c). The first and second source/drain regions 105a and 105b of the silicon semiconductor layer 105 may include majority carrier ions, and thus may have higher conductivity and lower electrical resistance than the channel region 105c.

The silicon semiconductor layer 105 may be a semiconductor layer of each of the first transistor T1, the second transistor T2, the fifth transistor T5, and the sixth transistor T6, which are described above, and may form a channel of the corresponding transistor.

The first gate insulating film GI1 may be disposed on the silicon semiconductor pattern PS. The first gate insulating film GI1 may include a silicon compound, a metal oxide, and/or the like. For example, the first gate insulating film GI1 may include silicon oxide, silicon nitride, silicon oxynitride, aluminum oxide, tantalum oxide, hafnium oxide, zirconium oxide, titanium oxide, and/or the like. The above materials may be used alone or in combinations thereof.

The first gate insulating film GI1 may cover an upper surface of the silicon semiconductor layer 105 except for portions in which contact holes CNT1 and CNT2 are formed and also cover side surfaces of the silicon semiconductor layer 105. Further, the first gate insulating film GI1 may cover an upper surface and a side surface of a silicon lower light blocking pattern 104. That is, the first gate insulating film GI1 may be disposed roughly over (e.g., may substantially cover) an entire surface of the base substrate 101.

The first conductive layer 110 is disposed on the first gate insulating film GI1. The first conductive layer 110 may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The first conductive layer 110 may include the first gate electrode 111 disposed in the silicon transistor region AR1.

The first gate electrode 111 may be a gate electrode of a silicon transistor. The first gate electrode 111 may be connected to the first electrode of the capacitor Cst. The first electrode of the capacitor Cst may be formed using the first gate electrode 111 itself or may be formed using a portion extending from the first gate electrode 111. For example, a portion of a pattern of the integrated first conductive layer may overlap the silicon semiconductor layer 105 to function as the first gate electrode 111 at the corresponding portion, and the other portion of the pattern may not overlap the silicon semiconductor layer 105 to function as the first electrode of the capacitor Cst, which overlaps a second electrode 141 of the capacitor Cst thereabove.

The capping film ILD1 is disposed on the first conductive layer 110. The capping film ILD1 may include silicon oxide. Because the capping film ILD1 is made of silicon oxide, the oxide semiconductor pattern PO stacked on the capping film ILD1 may be prevented or substantially prevented from being excessively doped with hydrogen ($H_2$), a threshold voltage of the oxide transistor may be prevented or substantially prevented from being negative-shifted, and thus the display quality of the display device 1 may be improved.

However, the material forming the capping film ILD1 is not limited to silicon oxide and may include a silicon compound, a metal oxide, and/or the like, which is different from the silicon oxide. For example, the capping film ILD1 may include silicon nitride, silicon oxynitride, aluminum oxide, tantalum oxide, hafnium oxide, zirconium oxide, titanium oxide, and/or the like. The above materials may be used alone or in combinations thereof.

The capping film ILD1 may be disposed on the first gate insulating film GI1 on which the first conductive layer 110 including the first gate electrode 111 is disposed and thus may serve to prevent or substantially prevent the first conductive layer 110 from being oxidized by a subsequent process (e.g., high temperature activation of the silicon semiconductor layer 105).

The oxide semiconductor pattern PO is disposed on the capping film ILD1. The oxide semiconductor pattern PO may include the oxide semiconductor layer 135. The oxide semiconductor layer 135 may be disposed in the oxide transistor region AR2. The oxide semiconductor layer 135 may include an oxide semiconductor. The oxide semiconductor may include one or more oxides selected from gallium indium zinc oxide (GIZO), zinc (Zn), indium (In), gallium (Ga), tin (Sn) cadmium (Cd), germanium (Ge), hafnium (Hf), and a combination thereof. The oxide semiconductor may include at least one of indium gallium zinc oxide (IGZO), zinc tin oxide (ZTO), and indium tin oxide (IZO), and/or the like.

The oxide semiconductor layer 135 may include a channel region 135c disposed to overlap a second gate electrode 142 thereabove in the thickness direction thereof and a first source/drain region 135a and a second source/drain region 135b of the oxide semiconductor layer 135, which are respectively located on one side and the other side of the channel region 135c. The first and second source/drain regions 135a and 135b of the oxide semiconductor layer 135 may be conductive regions and may have higher conductivity and lower electrical resistance than the channel region 135c.

The oxide semiconductor layer 135 may be a semiconductor layer of each of the third transistor T3, the fourth transistor T4, and the seventh transistor T7, which are described above, and may form a channel of the corresponding transistor.

The second gate insulating film GI2 is disposed on the oxide semiconductor pattern PO. The second gate insulating film GI2 may be disposed only in a partial region unlike the first gate insulating film GI1. For example, the second gate insulating film GI2 may cover an upper surface of the oxide semiconductor pattern PO except for portions in which contact holes CNT3 and CNT4 are formed to expose side surfaces of the oxide semiconductor pattern PO. That is, the second gate insulating film GI2 may have a pattern shape substantially the same as that of the oxide semiconductor pattern PO therebelow. For example, at least a portion of a side surface of the second gate insulating film GI2 may be aligned with the side surface of the oxide semiconductor pattern PO. Further, all of remaining portions of the second gate insulating film GI2 except for the third and fourth contact holes CNT3 and CNT4 may overlap the oxide semiconductor pattern PO, and at least a portion of the oxide semiconductor pattern PO may overlap the second gate insulating film GI2.

The second gate insulating film GI2 may include silicon oxide. Because the second gate insulating film GI2 is made of silicon oxide, the oxide semiconductor pattern PO disposed below the second gate insulating film GI2 may be prevented or substantially prevented from being excessively doped with hydrogen ($H_2$), the threshold voltage of the oxide transistor may be prevented or substantially prevented from being negative-shifted, and thus the display quality of the display device 1 may be improved.

However, the material forming the second gate insulating film GI2 is not limited to silicon oxide and may include a silicon compound, a metal oxide, and/or the like, which is different from silicon oxide. For example, the second gate insulating film GI2 may include silicon nitride, silicon oxynitride, aluminum oxide, tantalum oxide, hafnium oxide, zirconium oxide, titanium oxide, and/or the like. The above materials may be used alone or in combinations thereof.

In addition, the material forming the second gate insulating film GI2 may be identical or substantially similar to the material forming the capping film ILD1, and a thickness of the second gate insulating film GI2 may be greater than a thickness of the first gate insulating film GI1 or a thickness of the third gate insulating film GI3; however, embodiments of the present disclosure are not limited thereto.

By stacking the second gate insulating film GI2 between the oxide semiconductor layer 135 and the second gate electrode 142, an interval (e.g., separation/distance) between the oxide semiconductor layer 135 and the second gate electrode 142 may be increased. Effects thereof will be described with reference to FIG. 5.

Figure 5:
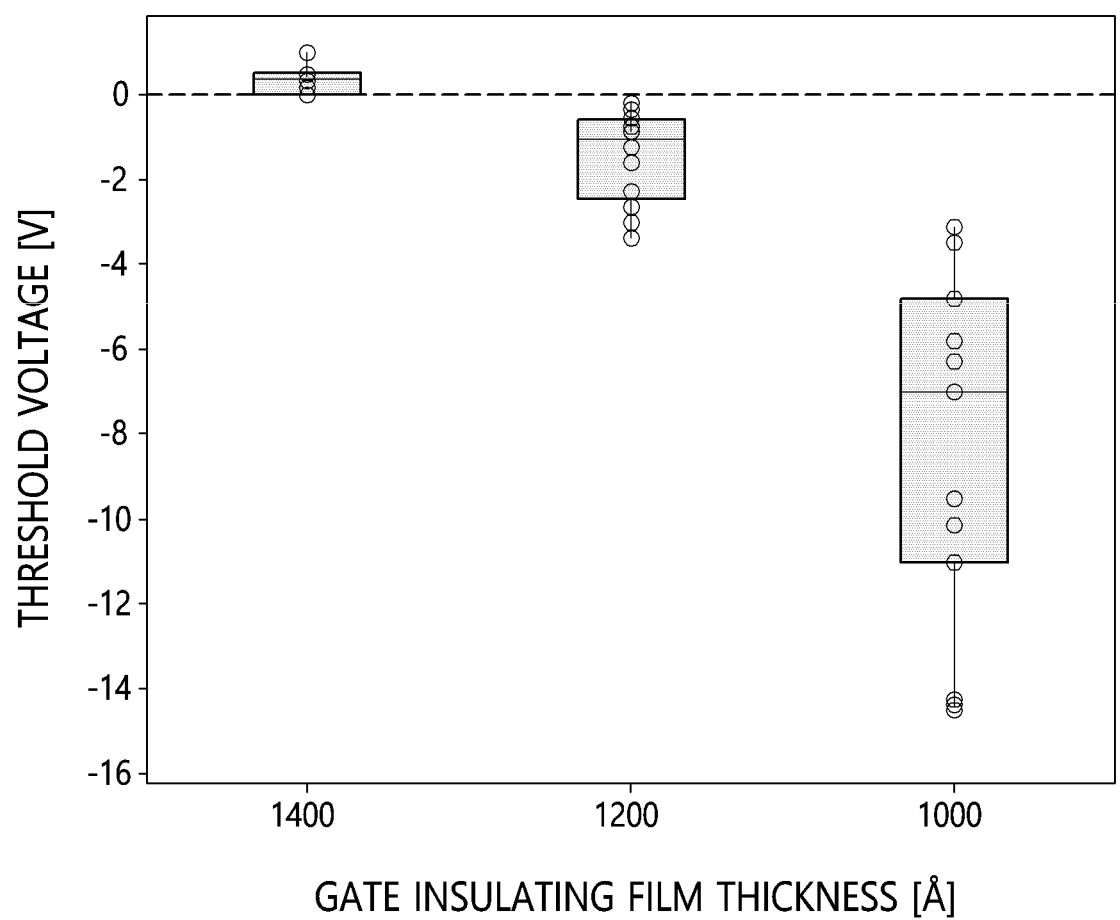
FIG. 5 is a graph illustrating a relationship between a thickness of a gate insulating film and a threshold voltage in an oxide transistor.

FIG. 5 is a graph illustrating a relationship between a thickness of a gate insulating film and a threshold voltage in an oxide transistor.

In graph of FIG. 5, it is shown that as the thickness of the gate insulating film of the oxide transistor increases, a negative shift of a threshold voltage may decrease and a deviation/variation of the threshold voltage may also decrease. In particular, in the above graph, it is shown that when the thickness of the gate insulating film of the oxide transistor is greater than or equal to a set or predetermined thickness (e.g., 1,400 Å), the threshold voltage may be prevented or substantially prevented from being negative-shifted (e.g., shifted in the negative direction) and the deviation/variation of the threshold voltage may also be prevented or substantially prevented from being increased.

An interval (e.g., separation/distance) between the oxide semiconductor layer 135 and the second gate electrode 142 may be greater than an interval (e.g., separation/distance) between the first gate electrode 111 and the second electrode 141 of the capacitor. For example, because the second gate insulating film GI2 is disposed between the oxide semiconductor layer 135 and the second gate electrode 142, a thickness of an insulating film (e.g., the second gate insulating film GI2 and the third gate insulating film GI3) disposed between the oxide semiconductor layer 135 and the second gate electrode 142 may be greater than a thickness of an insulating film (e.g., the capping film ILD1 and the third gate insulating film GI3) disposed between the first gate electrode 111 and the second electrode 141 of the capacitor.

The third gate insulating film GI3, which will be described below, may have a thickness relatively smaller than the first gate insulating film Gi1 or the second gate insulating film GI2, and the third gate insulating film GI3 may be used as a dielectric of the capacitor Cst so that the capacitance of the capacitor Cst may be increased. In this case, the third gate insulating film GI3 may also be disposed between the oxide semiconductor layer 135 and the second gate electrode 142, the second gate insulating film GI2 may serve as a gate insulating film of the oxide transistor together with the third gate insulating film GI3 in the oxide transistor region AR2. Although the third gate insulating film GI3 having a relatively small thickness is disposed between the oxide semiconductor layer 135 and the second gate electrode 142 in the oxide transistor region AR2, the second gate insulating film GI2 is further disposed between the oxide semiconductor layer 135 and the second gate electrode 142, and thus the interval between the oxide semiconductor layer 135 and the second gate electrode 142 may be increased. That is, the thickness of the insulating film disposed between the oxide semiconductor layer 135 and the second gate electrode 142 may be increased. The thickness of the insulating film disposed between the oxide semiconductor layer 135 and the second gate electrode 142 may be 1,400 Å or more; however, embodiments of the present disclosure are not limited thereto.

As the thickness of the gate insulating film of the oxide transistor is increased, the negative shift of the threshold voltage of the oxide transistor may be substantially reduced, suppressed, or prevented and the deviation/variation of the threshold voltage of the oxide transistor for each pixel may be reduced. Therefore, the display quality of the display device 1 may be prevented from being degraded or degradation thereof may be substantially reduced.

Referring again to FIG. 4, the third gate insulating film GI3 is disposed on the capping film ILD1 on which the second gate insulating film GI2 and the oxide semiconductor pattern PO are disposed. The third gate insulating film GI3 may include silicon nitride. The third gate insulating film GI3, which is made of silicon nitride, may become the dielectric of the capacitor Cst together with the capping film ILD1, which is made of silicon oxide. In this case, because a dielectric constant of silicon nitride is greater than a dielectric constant of silicon oxide, due to the third gate insulating film GI3 being made of silicon nitride, the capacitance of the capacitor Cst may be increased.

However, the material forming the third gate insulating film GI3 is not limited to silicon oxide and may include a silicon compound, a metal oxide, and/or the like, which is different from the silicon oxide. For example, the third gate insulating film GI3 may include silicon oxide, silicon oxynitride, aluminum oxide, tantalum oxide, hafnium oxide, zirconium oxide, titanium oxide, and/or the like. The above materials may be used alone or in combinations thereof.

Further, the material forming the third gate insulating film GI3 may be different from the material forming the capping film ILD1 and the second gate insulating film GI2; however, embodiments of the present disclosure are not limited thereto.

The third gate insulating film GI3 may cover an upper surface of the second gate insulating film GI2 except for the portions in which the contact holes CNT3 and CNT4 are formed and may also cover side surfaces of the second gate insulating film GI2 and the oxide semiconductor layer 135. The third gate insulating film GI3 may be disposed roughly over (e.g., may substantially cover) the entire surface of the base substrate 101. Further, the thickness of the third gate insulating film GI3 may be identical or substantially similar to a thickness of the capping film ILD1; however, embodiments of the present disclosure are not limited thereto.

The third gate insulating film GI3 may perform different functions according to a position thereof. For example, the third gate insulating film GI3 located in the oxide transistor region AR2 may be disposed between the oxide semiconductor layer 135 and the second gate electrode 142 to serve as a gate insulating film of the oxide transistor. The third gate insulating film GI3 located in a region, which overlaps the second electrode 141 of the capacitor Cst and the first electrode of the capacitor Cst connected to the first gate electrode 111, may serve as the dielectric of the capacitor Cst together with another insulating layer (e.g., the capping film ILD1) between the second electrode 141 of the capacitor Cst and the first electrode of the capacitor Cst connected to the first gate electrode 111. That is, the second electrode 141 of the capacitor Cst may be opposite to the first electrode of the capacitor Cst connected to the first gate electrode 111 with the third gate insulating film GI3 interposed therebetween in the overlapping region to form the capacitor Cst.

As described above, the third gate insulating film GI3 may serve as a gate insulating film in a region that overlaps the oxide semiconductor layer 135 and the second gate electrode 142 of the transistor disposed in the oxide transistor region AR2 and may serve as a dielectric of the capacitor Cst in a region that overlaps the second electrode 141 of the capacitor Cst and the first electrode of the capacitor. As described above, in different regions, one insulating film (e.g., the third gate insulating film GI3) is used as the gate insulating film of the transistor or the dielectric of the capacitor Cst included in the oxide transistor region AR2, and thus a fabrication process thereof may be simplified as compared with the case in which individual insulating films are separately formed. Furthermore, because the number of insulating films included in the display device 1 is reduced, a thickness of the display device 1 may be reduced.

In addition, as described above, each of the capping film ILD1 and the third gate insulating film GI3 disposed between the first gate electrode 111 and the second electrode 141 of the capacitor Cst may have a thickness smaller than that of the second gate insulating film GI2 or the first gate insulating film GI1. Accordingly, an interval between the first gate electrode 111 and the second electrode 141 of the capacitor Cst may be reduced, and the capacitance of the capacitor Cst formed between the first gate electrode 111 itself and/or a portion extending from the first gate electrode 111 and the second electrode 141 of the capacitor Cst may be increased.

The second conductive layer 140 is disposed on the third gate insulating film GI3. The second conductive layer 140 may include the second electrode 141 of the capacitor Cst disposed in the silicon transistor region AR1 and the second gate electrode 142 of the transistor disposed in the oxide transistor region AR2. The second conductive layer 140 may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The oxide semiconductor layer 135 of the transistor disposed in the oxide transistor region AR2 may be disposed above the first gate electrode 111 of the transistor disposed in the silicon transistor region AR1. In other words, the capping film ILD1 may be stacked on the first gate electrode 111, and the oxide semiconductor layer 135 may be disposed on the capping film ILD1.

The oxide semiconductor layer 135 of the transistor disposed in the oxide transistor region AR2 may be located below the second electrode 141 of the capacitor Cst disposed in the silicon transistor region AR1. In other words, the second gate insulating film GI2 and the third gate insulating film GI3 may be disposed on the oxide semiconductor layer 135 of the transistor disposed in the oxide transistor region AR2, and the second conductive layer 140 including the second electrode 141 of the capacitor Cst and the second gate electrode 142 of the transistor disposed in the oxide transistor region AR2 may be disposed on the third gate insulating film GI3.

The second electrode 141 of the capacitor Cst disposed in the silicon transistor region AR1 and the second gate electrode 142 of the transistor disposed in the oxide transistor region AR2, which form the second conductive layer 140, may include the same material. Further, the second electrode 141 of the capacitor Cst and the second gate electrode 142 may be formed at the same layer.

For example, both of the second electrode 141 of the capacitor Cst disposed in the silicon transistor region AR1 and the second gate electrode 142 of the transistor disposed in the oxide transistor region AR2 may be disposed on the same insulating film (e.g., the third gate insulating film GI3).

Further, the second electrode 141 of the capacitor Cst disposed in the silicon transistor region AR1 and the second gate electrode 142 of the transistor disposed in the oxide transistor region AR2 may be concurrently (e.g., simultaneously) formed using one mask. As described above, because the second gate electrode 142 of the transistor disposed in the oxide transistor region AR2 is formed concurrently (e.g., simultaneously) with the second electrode 141 of the capacitor Cst disposed in the silicon transistor region AR1 using the same mask without being formed by a separate mask process using a separate conductive layer, the number of mask processes may be reduced.

The interlayer insulating film ILD2 is disposed on the third gate insulating film GI3 on which the second conductive layer 140 is disposed. The interlayer insulating film ILD2 may include a silicon compound, a metal oxide, and/or the like. For example, the interlayer insulating film ILD2 may include silicon oxide, silicon nitride, silicon oxynitride, aluminum oxide, tantalum oxide, hafnium oxide, zirconium oxide, titanium oxide, and/or the like. The above materials may be used alone or in combinations thereof.

A thickness of the interlayer insulating film ILD2 may be greater than a thickness of each of the first gate insulating film GI1, the third gate insulating film GI3, and the capping film ILD1, which are described above. Further, the interlayer insulating film ILD2 may be formed of the same material as the capping film ILD1; however, embodiments of the present disclosure are not limited thereto.

The third conductive layer 150 is disposed on the interlayer insulating film ILD2. The third conductive layer 150 may include one or more metals selected from aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The third conductive layer 150 may include a first source/drain electrode 151 and a second source/drain electrode 152 of the transistor disposed in the silicon transistor region AR1 and a first source/drain electrode 153 and a second source/drain electrode 154 of the transistor disposed in the oxide transistor region AR2.

In the transistor disposed in the silicon transistor region AR1, the first source/drain electrode 151 may be connected to the first source/drain region 105a of the silicon semiconductor layer 105 through the first contact hole CNT1, which passes through the interlayer insulating film ILD2, the third gate insulating film GI3, the capping film ILD1, and the first gate insulating film Gil and exposes the first source/drain region 105a of the silicon semiconductor layer 105. The second source/drain electrode 152 may be connected to the second source/drain region 105b of the silicon semiconductor layer 105 through the second contact hole CNT2, which passes through the interlayer insulating film ILD2, the third gate insulating film GI3, the capping film ILD1, and the first gate insulating film Gil and exposes the second source/drain region 105b of the silicon semiconductor layer 105.

In the transistor disposed in the oxide transistor region AR2, the first source/drain electrode 153 may be connected to the first source/drain region 135a of the oxide semiconductor layer 135 through the third contact hole CNT3, which passes through the interlayer insulating film ILD2, the third gate insulating film GI3, and the second gate insulating film GI2 and exposes the first source/drain region 135a of the oxide semiconductor layer 135. The second source/drain electrode 154 may be connected to the second source/drain region 135b of the oxide semiconductor layer 135 through the fourth contact hole CNT4, which passes through the interlayer insulating film ILD2, the third gate insulating film GI3, and the second gate insulating film GI2 and exposes the second source/drain region 135b of the oxide semiconductor layer 135.

The first via layer VIA1 is disposed on the third conductive layer 150. The first via layer VIA1 may include an inorganic insulating material and/or an organic insulating material such as a polyacrylate resin, an epoxy resin, a phenolic resin, a polyamide resin, a polyimide resin, an unsaturated polyester resin, a polyphenylene ether resin, a polyphenylene sulfide resin, BCB, and/or the like.

The fourth conductive layer 160 is disposed on the first via layer VIA1. The fourth conductive layer 160 may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The fourth conductive layer 160 may include a connection electrode 161 and an upper light blocking pattern 163. A fifth contact hole CNT5, which exposes the second source/drain electrode 152 of the transistor disposed in the silicon transistor region AR1, may be disposed in the first via layer VIA1, and the connection electrode 161 may be connected to the second source/drain electrode 152 through the fifth contact hole CNT5.

The upper light blocking pattern 163 may serve to prevent or substantially prevent light incident from an upper direction of the display panel 100 from entering the oxide semiconductor layer 135 disposed below the upper light blocking pattern 163. In other words, the upper light blocking pattern 163 may serve to shield the oxide semiconductor layer 135 from incident light. The upper light blocking pattern 163 may be disposed to overlap at least the channel region 135c of the oxide semiconductor layer 135.

The second via layer VIA2 is disposed on the connection electrode 161. The second via layer VIA2 may include an inorganic insulating material and/or an organic insulating material such as a polyacrylate resin, an epoxy resin, a phenolic resin, a polyamide resin, a polyimide resin, an unsaturated polyester resin, a polyphenylene ether resin, a polyphenylene sulfide resin, BCB, and/or the like.

The pixel electrode ANO is disposed on the second via layer VIA2. The pixel electrode ANO may be an anode electrode. The pixel electrode ANO may be disposed separately for each pixel. For example, the pixel electrode ANO of each pixel is separated from (e.g., electrically isolated) from the pixel electrode ANO of a neighboring pixel. The pixel electrode ANO may be electrically connected to the connection electrode 161 through a sixth contact hole CNT6, which passes through the second via layer VIA2 and exposes a portion of the connection electrode 161.

The pixel electrode ANO is not limited thereto and may have a stacked film structure in which a material layer having a high work function such as indium tin oxide (ITO), indium zinc oxide (IZO), zinc oxide (ZnO), or indium oxide ($In_2O_3$) and a reflective material layer, such as silver (Ag), magnesium (Mg), aluminum (Al), platinum (Pt), lead (Pb), gold (Au), nickel (Ni), neodium (Nd), iridium (Ir), chromium (Cr), lithium (Li), calcium (Ca), or a mixture thereof are stacked. A layer having a high work function may be disposed above the reflective material layer and disposed close to a light-emitting layer EL. The pixel electrode ANO may have a multilayer structure of ITO/Mg, ITO/MgF, ITO/Ag, and ITO/Ag/ITO; however, embodiments of the present disclosure are not limited thereto.

The pixel definition film PDL may be disposed on the pixel electrode ANO. The pixel definition film PDL may include an opening that partially exposes the pixel electrode ANO. The pixel definition film PDL may include an organic insulating material or an inorganic insulating material. For example, the pixel definition film PDL may include at least one of a polyimide resin, an acrylic resin, a silicone compound, and a polyacrylic resin, and/or the like.

The light-emitting layer EL is disposed on the pixel electrode ANO exposed by the pixel definition film PDL. The light-emitting layer EL may include an organic material layer. The organic material layer of the light-emitting layer may include an organic light-emitting layer and may further include a hole injection/transport layer and/or an electron injection/transport layer.

A cathode electrode CAT may be disposed on the light-emitting layer EL. The cathode electrode CAT may be a common electrode disposed over an entirety of pixels without distinguishing the pixels PX. In other words, the cathode electrode CAT may be common to all, and cover all of, the pixels Each of the pixel electrode ANO, the light-emitting layer EL, and the cathode electrode CAT may form an organic light-emitting element.

The cathode electrode CAT may include a material layer having a low work function, such as Li, Ca, LiF/Ca, LiF/Al, Al, Mg, Ag, Pt, Pd, Ni, Au Nd, Ir, Cr, BaF, Ba, a compound thereof, or a mixture thereof (e.g., a mixture of Ag and Mg, etc.). The cathode electrode CAT may further include a transparent metal oxide layer disposed on the material layer having the low work function.

The pixel electrode ANO, the light-emitting layer EL, and the cathode electrode CAT may constitute an organic light-emitting element.

A thin film encapsulation layer 170 including a first inorganic film 171, a first organic film 172, and a second inorganic film 173 is disposed above the cathode electrode CAT. The first inorganic film 171 and the second inorganic film 173 may be in contact with each other at an end portion of the thin film encapsulation layer 170. The first organic film 172 may be sealed (e.g., sealed from the outside) by the first inorganic film 171 and the second inorganic film 173.

Each of the first inorganic film 171 and the second inorganic film 173 may include silicon nitride, silicon oxide, silicon oxynitride, and/or the like. The first organic film 172 may include an organic insulating material.

Hereinafter, a method of manufacturing a display device according to an embodiment will be described.

Figure 6:
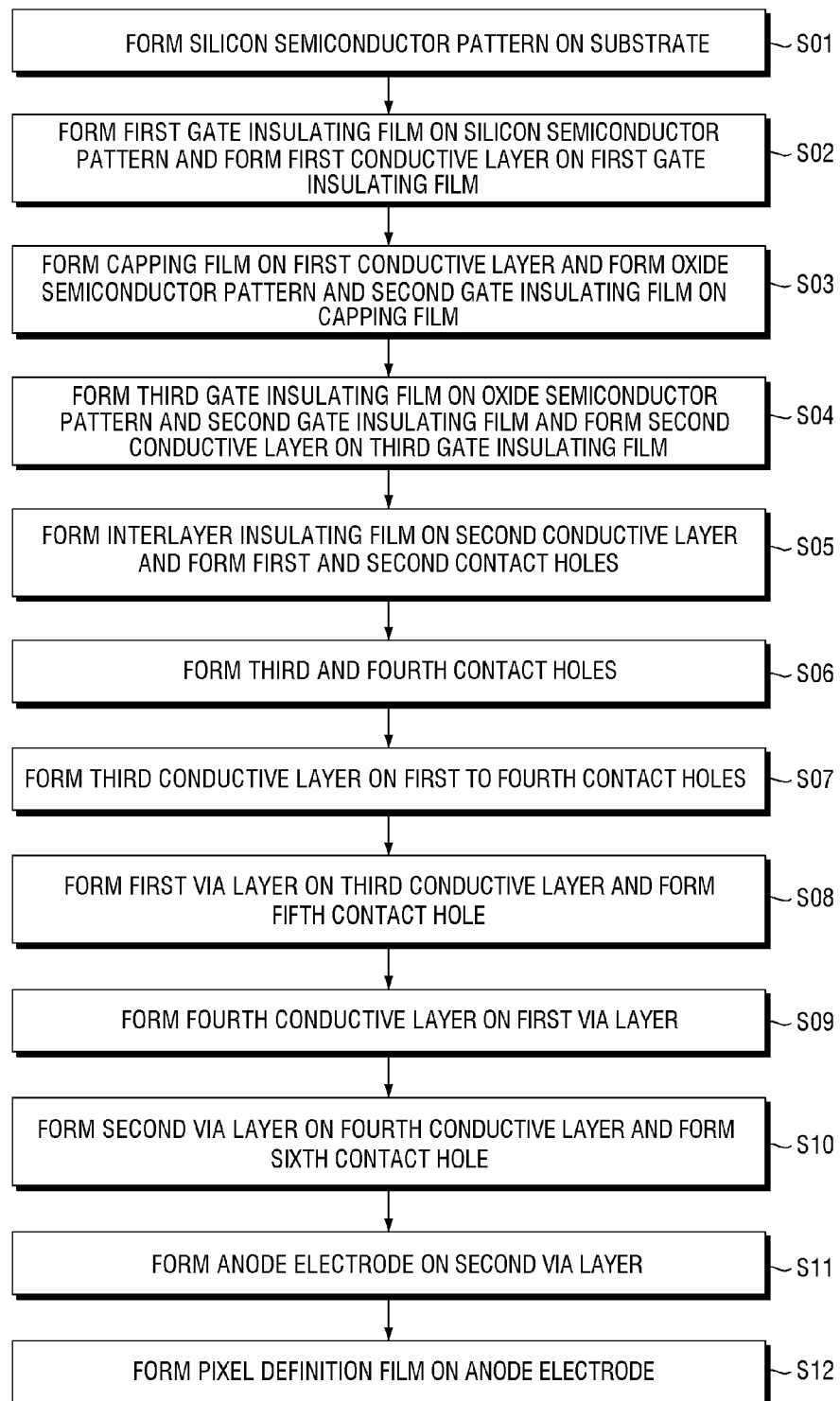
FIG. 6 is a flowchart illustrating a method of manufacturing a display device according to an example embodiment.

FIG. 6 is a flowchart illustrating a method of manufacturing a display device according to an embodiment, and FIGS. 7 to 18 are cross-sectional views illustrating process operations of the method of manufacturing the display device according to the embodiment.

Figure 7:
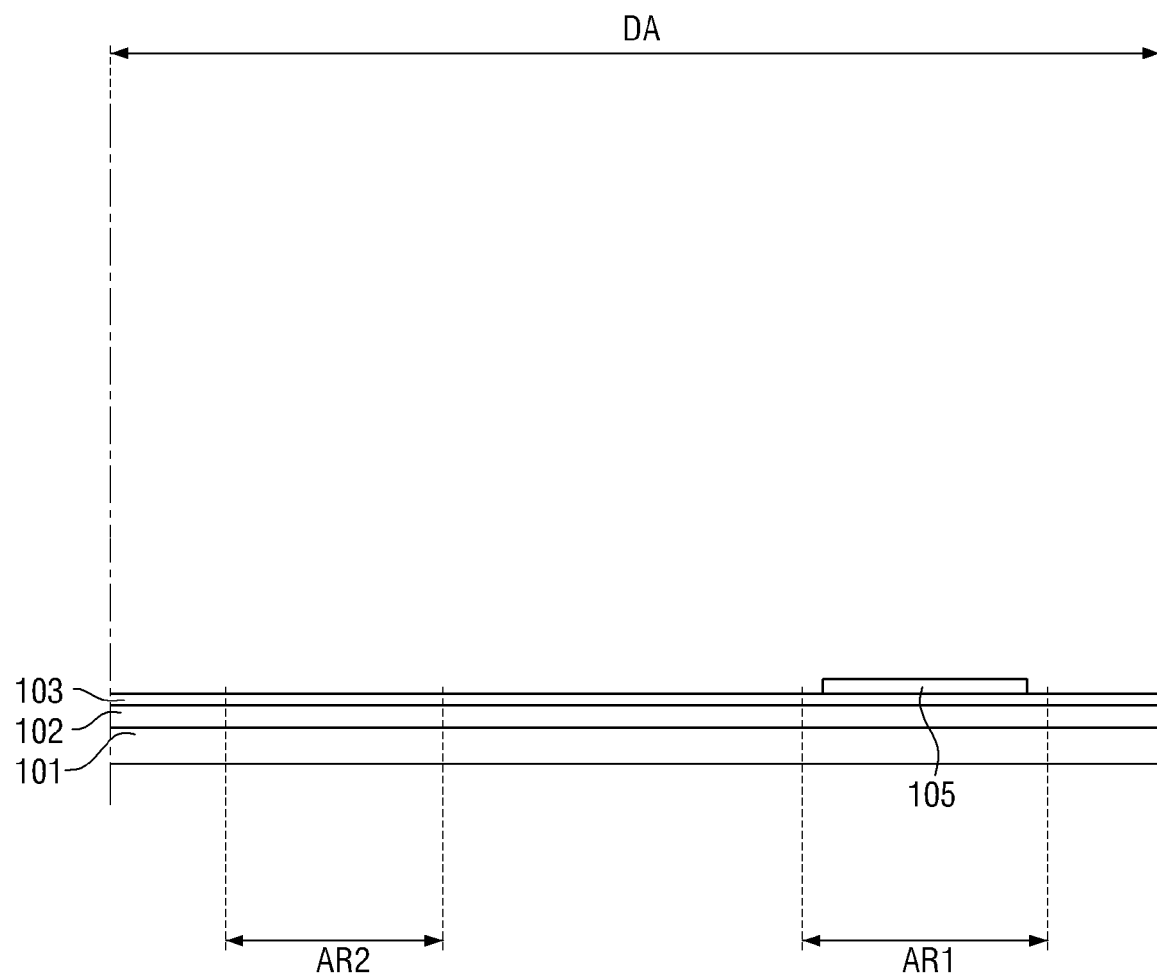
FIGS. 7-18 are cross-sectional views illustrating process operations of a method of manufacturing a display device according to an embodiment.

Referring to FIGS. 6 and 7, first, a display region DA including a silicon transistor region AR1 and an oxide transistor region AR2 and a non-display region NDA disposed around the display region DA are defined, and a base substrate 101 is provided on which a silicon semiconductor pattern PS including a silicon semiconductor layer 105 disposed in the silicon transistor region AR1 is disposed (501).

For example, a barrier layer 102 and a buffer layer 103 are sequentially stacked on the base substrate 101, and the silicon semiconductor layer 105 is formed on the buffer layer 103. A material for a silicon semiconductor layer may be deposited on an entire surface of the buffer layer 103 and then patterned by a photolithography process so that the silicon semiconductor pattern PS including the silicon semiconductor layer 105 may be formed as illustrated in FIG. 7.

Figure 8:
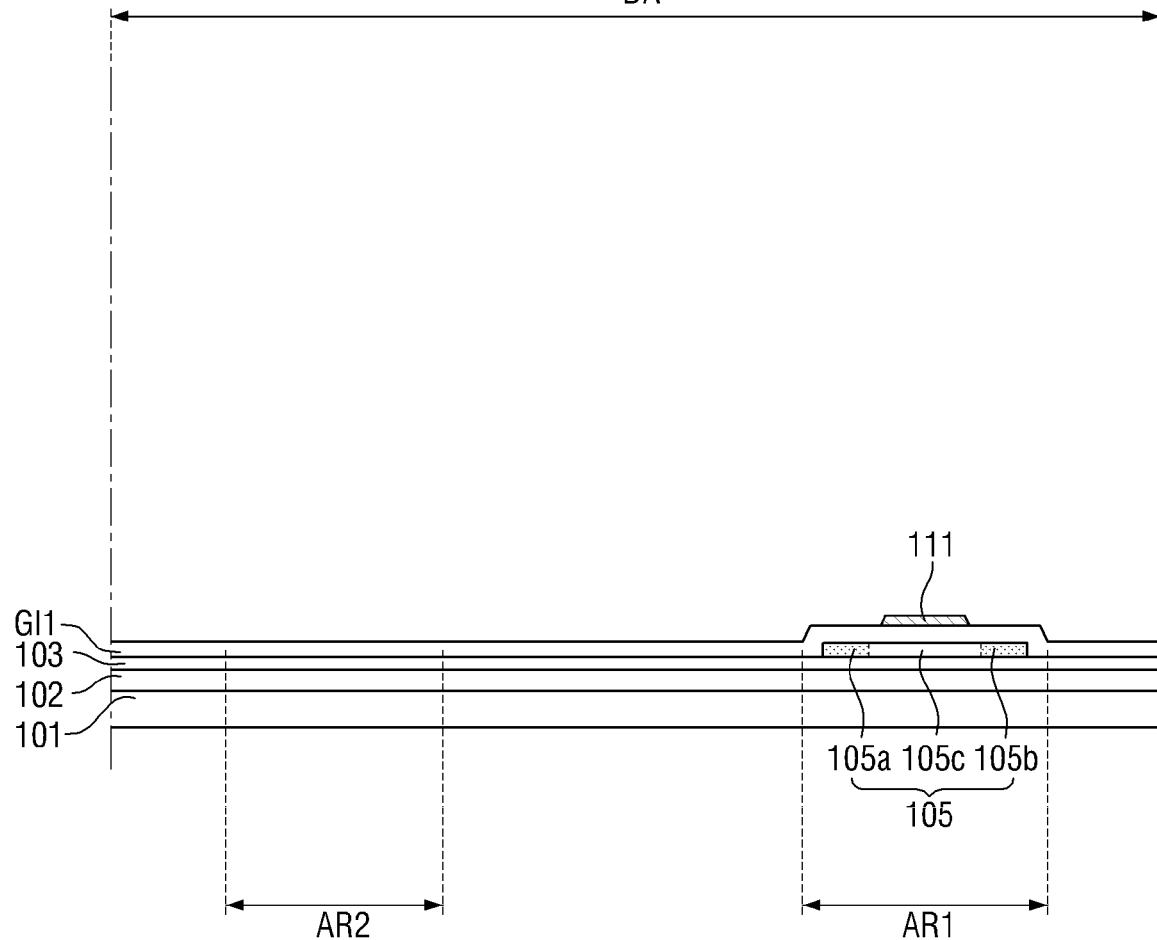

Subsequently, referring to FIG. 8, a first gate insulating film GI1 is formed on the silicon semiconductor pattern PS, and a first conductive layer 110 including a first gate electrode 111 is formed on the first gate insulating film GI1 (S02).

For example, the first gate insulating film Gil is formed on the entire surface of the buffer layer 103 on which the silicon semiconductor layer 105 is formed. Subsequently, the first gate electrode 111 is formed on the first gate insulating film GI1. That is, a material layer for a first conductive layer may be deposited on an entire surface of the first gate insulating film Gil and then patterned by a photolithography process so that the first gate electrode 111 may be formed as illustrated in FIG. 8.

Figure 9:
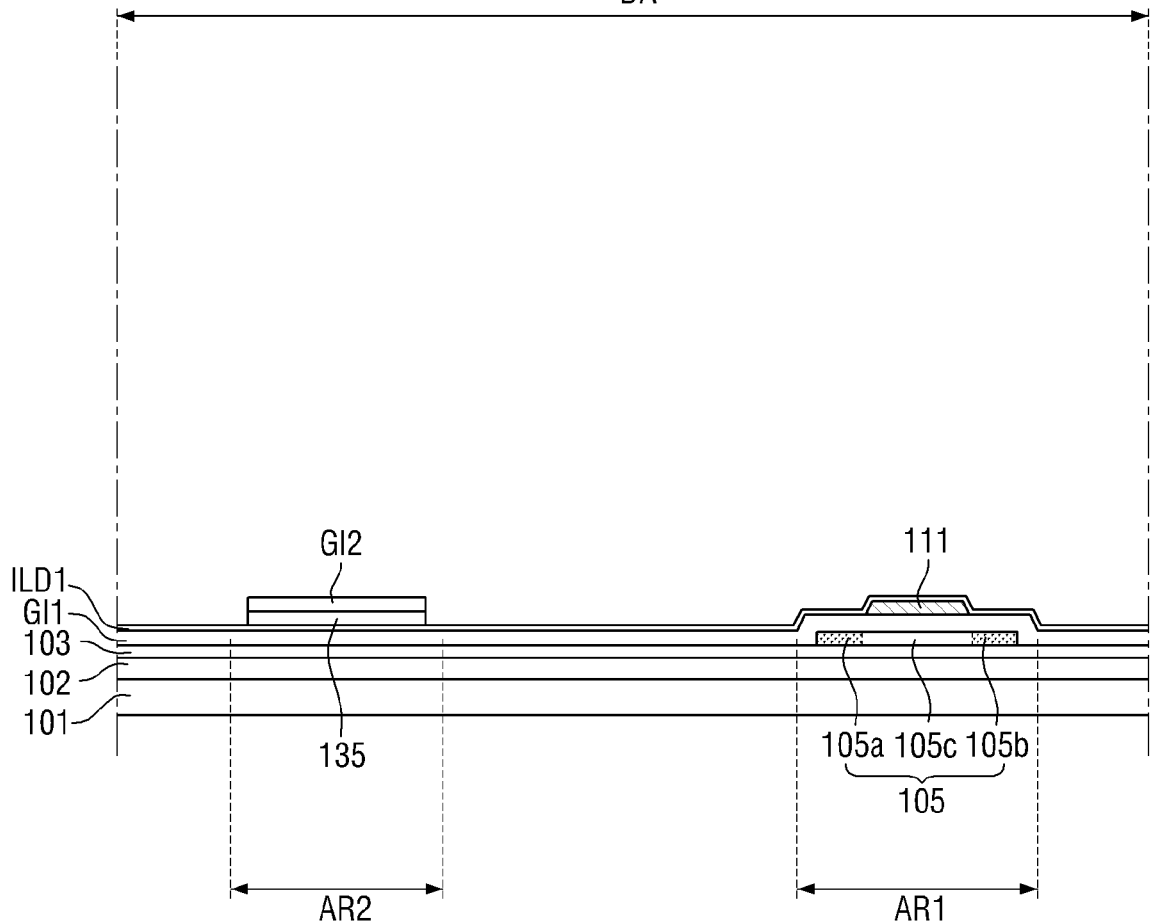

Subsequently, referring to FIG. 9, a capping film ILD1 is formed on the first conductive layer 110, and an oxide semiconductor pattern PO and a second gate insulating film GI2 are formed on the capping film ILD1 (S03).

For example, the capping film ILD1 is formed on the entire surface of the first gate insulating film Gil on which the first conductive layer 110 is formed. Subsequently, the oxide semiconductor pattern PO and the second gate insulating film GI2 are formed on the capping film ILD1. The oxide semiconductor pattern PO and the second gate insulating film GI2 may be formed by one mask process. For example, a material layer for an oxide semiconductor layer is deposited on an entire surface of the capping film ILD1 on which the first conductive layer 110 is formed, and subsequently, a material layer for a second gate insulating film is deposited on the deposited entire surface of the material layer for the oxide semiconductor layer. Subsequently, the material layer for the second gate insulating film may be coated with a photoresist layer, a photoresist pattern may be formed by exposure and development, and then the material layer for the second gate insulating film and the material layer for the oxide semiconductor layer may be sequentially etched using the photoresist pattern as an etching mask, and thus the second gate insulating film GI2 and the oxide semiconductor layer 135 may be formed as illustrated in FIG. 9. Thereafter, the photoresist pattern is removed by a stripping or ashing process. In the above, the case in which the photoresist pattern is used as the etching mask until the oxide semiconductor layer 135 is patterned is illustrated. However, a patterned upper layer may be used as a hard mask for etching a layer thereunder. In this case, the photoresist pattern may be used as an etching mask together with a hard mask. As another example, after the hard mask is formed, the photoresist pattern may be removed and a layer under the hard mask may be etched using the hard mask as the etching mask.

Figure 10:
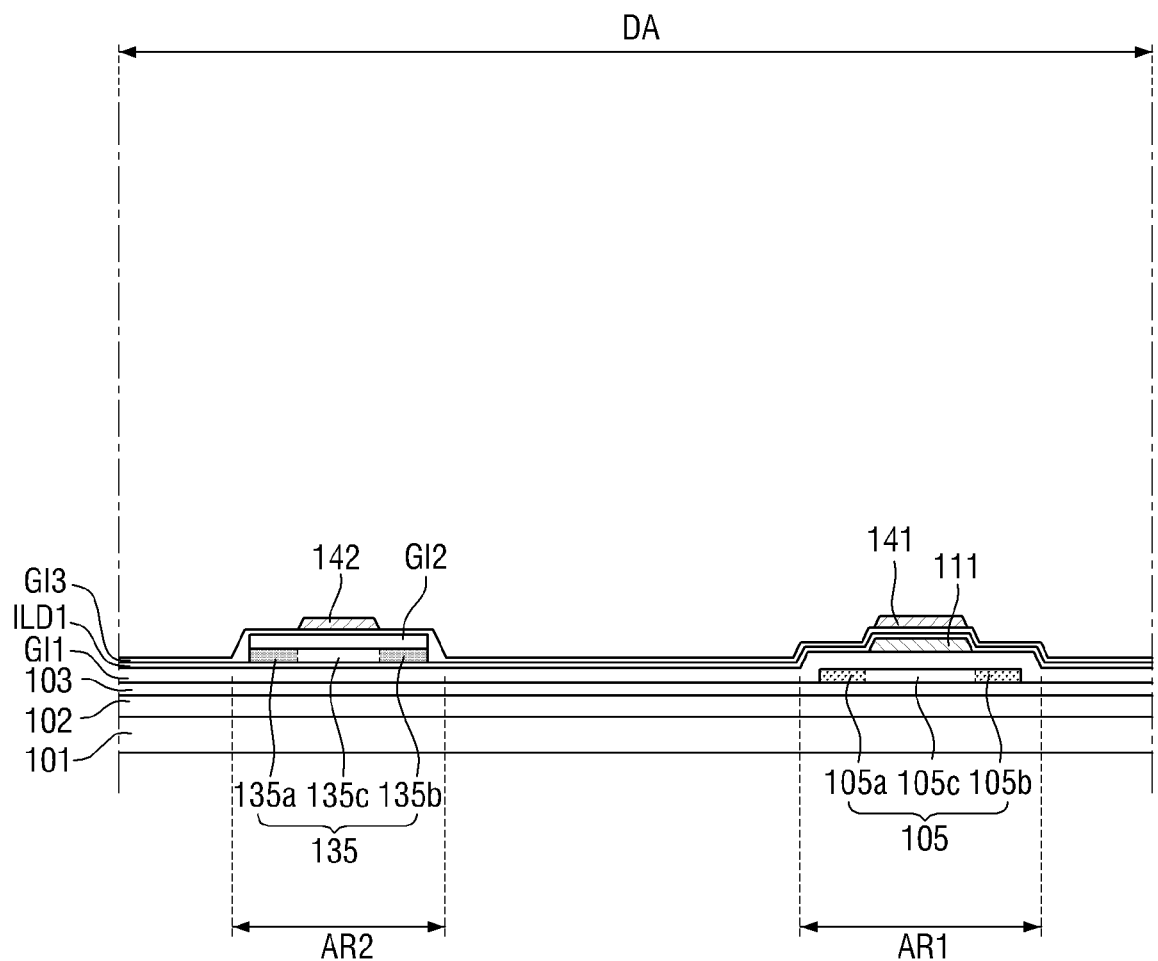

Subsequently, referring to FIG. 10, a third gate insulating film GI3 is formed on the oxide semiconductor pattern PO and the second gate insulating film GI2, and a second conductive layer 140 including a second electrode 141 of a capacitor Cst and a second gate electrode 142 is formed on the third gate insulating film GI3 (S04).

For example, the third gate insulating film GI3 is deposited on the entire surface of the capping film ILD1 on which the oxide semiconductor pattern PO and the second gate insulating film GI2 are disposed, and the second electrode 141 of the capacitor Cst and the second gate electrode 142 are concurrently (e.g., simultaneously) formed on the third gate insulating film GI3. The patterned second electrode 141 of the capacitor Cst and the patterned second gate electrode 142 may be formed by one mask process. That is, a material for a second conductive layer is deposited on an entire surface of the third gate insulating film GI3 and then patterned by a photolithography process so that the second conductive layer 140 including the second electrode 141 of the capacitor Cst and the second gate electrode 142 may be formed as illustrated in FIG. 10.

Figure 11:
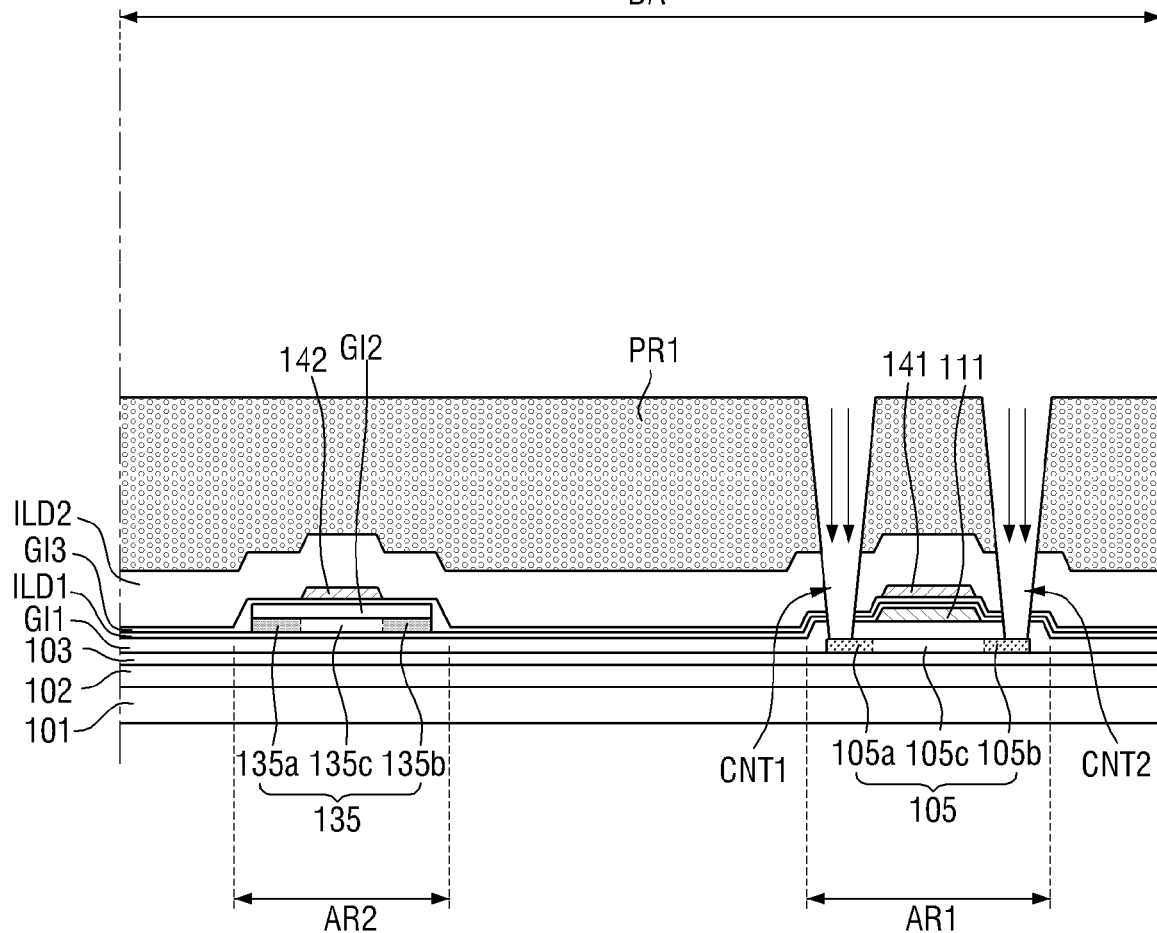

Subsequently, referring to FIG. 11, an interlayer insulating film ILD2 is stacked on the second conductive layer 140 including the second electrode 141 of the capacitor Cst and the second gate electrode 142, and a first contact hole CNT1 and a second contact hole CNT2 that expose a portion of the silicon semiconductor layer 105 in the display region DA are formed (505).

The contact holes CNT1 and CNT2 may be formed by one mask process. The first contact hole CNT1 and the second contact hole CNT2 may be concurrently (e.g., simultaneously) formed using the same mask. For example, an insulating layer for an interlayer insulating film is deposited on the entire surface of the third gate insulating film GI3 on which the second conductive layer 140 is formed.

Subsequently, a first photoresist pattern PR1 that exposes a portion of the silicon semiconductor layer 105 is formed on the insulating layer for the interlayer insulating film, and the insulating layer for the interlayer insulating film, the third gate insulating film GI3, the capping film ILD1, and the first gate insulating film Gil are etched using the first photoresist pattern PR1 as an etching mask so that the first contact hole CNT1 and the second contact hole CNT2, which expose the portion of the silicon semiconductor layer 105, are formed.

Figure 12:
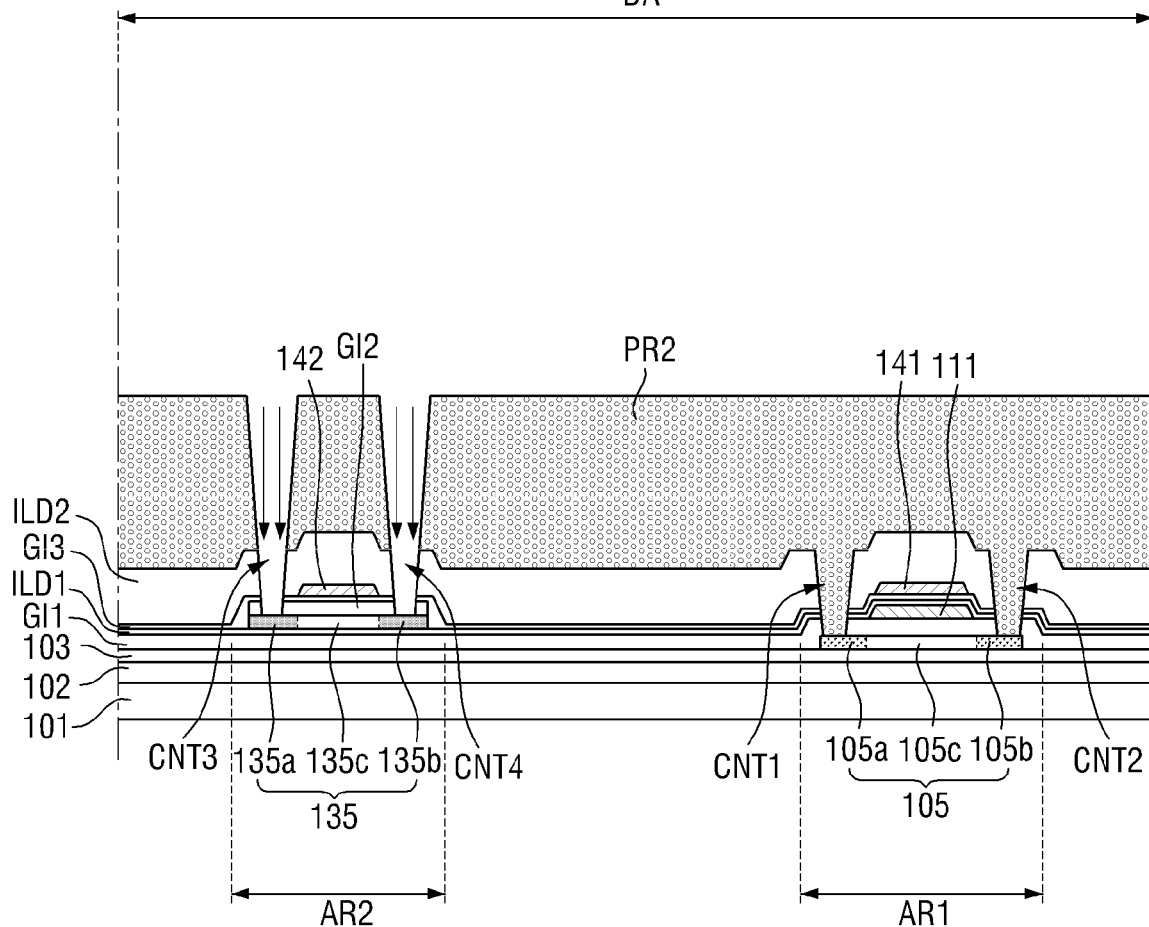

Subsequently, referring to FIG. 12, a third contact hole CNT3 and a fourth contact hole CNT4, which expose a portion of the oxide semiconductor layer 135, are formed (S06).

The contact holes CNT3 and CNT4 may be formed by a mask process. The third contact hole CNT3 and the fourth contact hole CNT4 may be concurrently (e.g., simultaneously) formed using the same mask. For example, a second photoresist pattern PR2, which exposes a portion of the oxide semiconductor layer 135, is formed on the interlayer insulating film ILD2 in which the first contact hole CNT1 and the second contact hole CNT2 are formed, and the interlayer insulating film ILD2, the third gate insulating film GI3, and the second gate insulating film GI2 are etched using the second photoresist pattern PR2 as an etching mask so that the third contact hole CNT3 and the fourth contact hole CNT4, which expose the portion of the oxide semiconductor layer 135, are formed.

Figure 13:
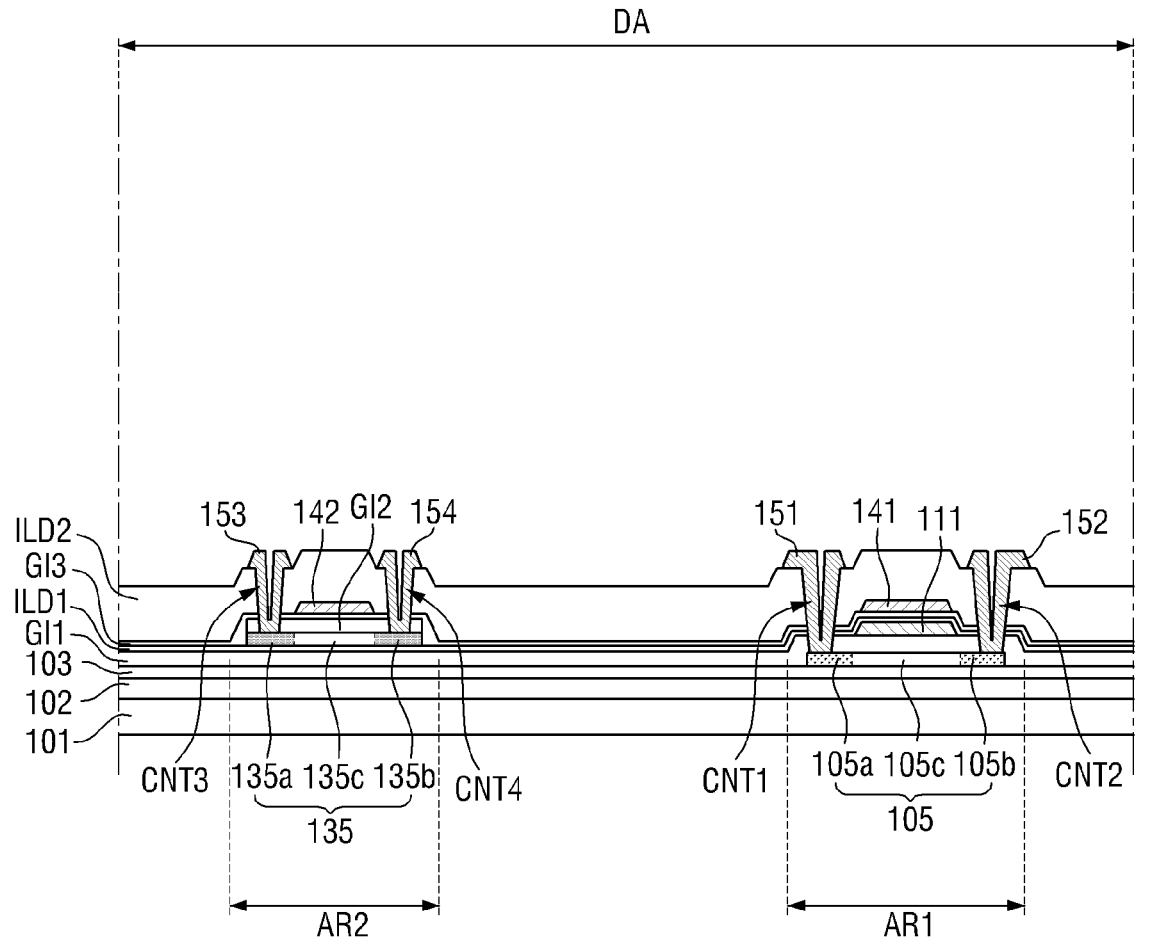
Figure 16:
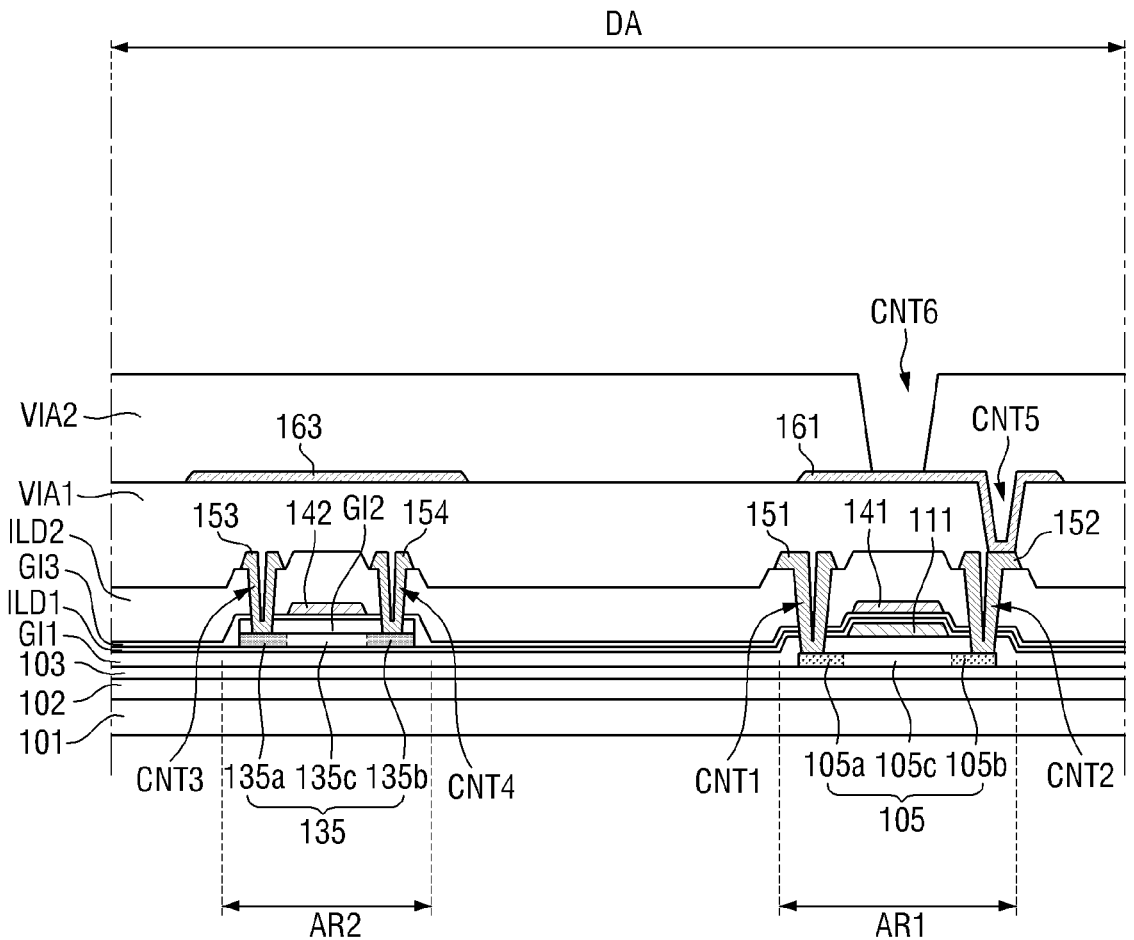

Subsequently, referring to FIG. 13, a patterned third conductive layer 150 is formed on the interlayer insulating film ILD2 (S07). The patterned third conductive layer 150 may be formed by a mask process. For example, a material layer for a third conductive layer is deposited on an entire surface of the interlayer insulating film ILD2. In the deposition process, the material layer for the third conductive layer may be deposited on inner sides of the first to fourth contact holes CNT1, CNT2, CNT3, and CNT4. Therefore, the first and second source/drain electrodes 151 and 152 of the transistor disposed in the silicon transistor region AR1 and the first and second source/drain electrodes 153 and 154 of the transistor disposed in the oxide transistor region AR2 may be respectively connected to the silicon semiconductor layer 105 and the oxide semiconductor layer 135. Subsequently, the material layer for the third conductive layer is coated with a photoresist layer, a photoresist pattern is formed by exposure and development, and then the material layer for the third conductive layer is etched using the photoresist pattern as an etching mask. Thereafter, the photoresist pattern is removed by a stripping or ashing process, and thus the patterned third conductive layer 150 is completely formed as illustrated in FIG. 16.

Figure 14:
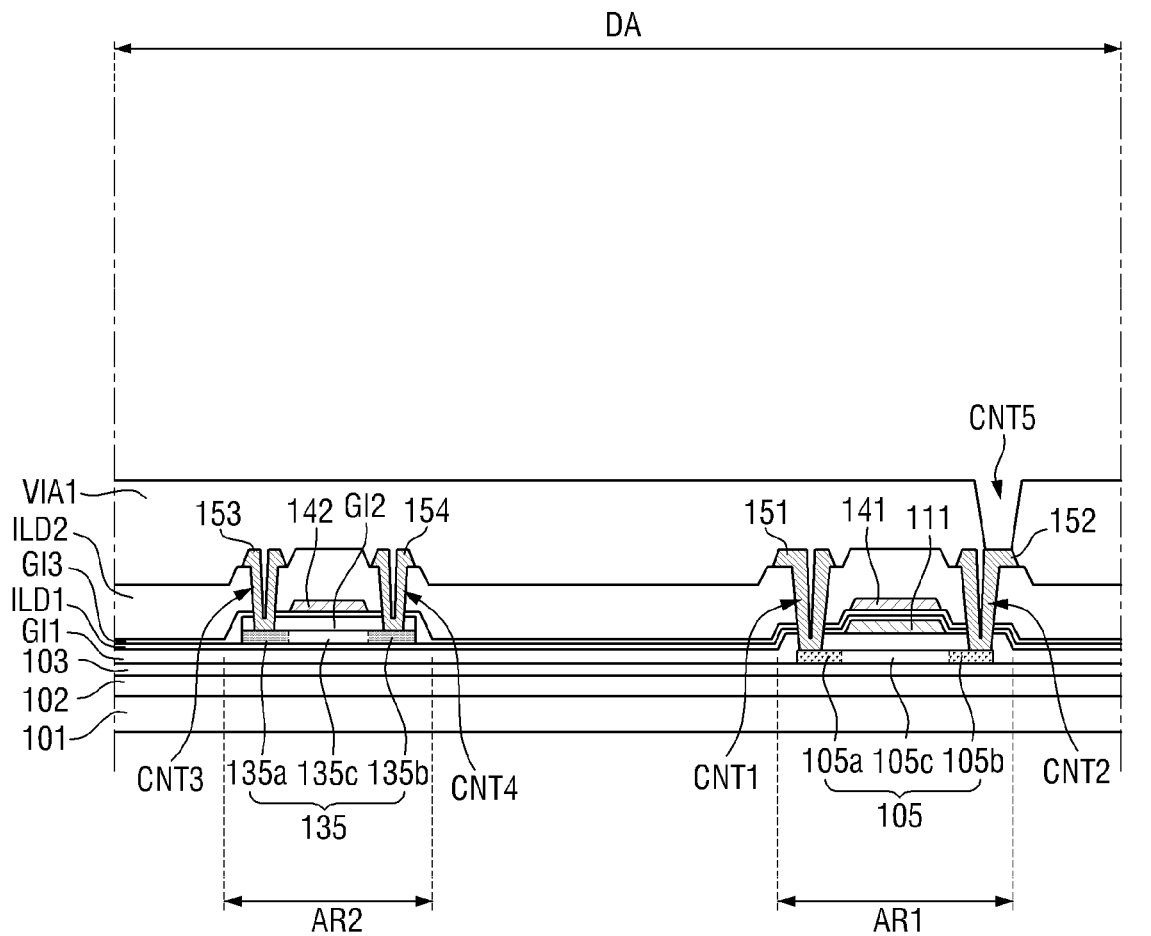

Subsequently, referring to FIG. 14, a first via layer VIA1 is formed on the third conductive layer 150, and a fifth contact hole CNT5, which exposes portions of the first and second source/drain electrodes 151 and 152 of the transistor disposed in the silicon transistor region AR1, is formed (S08).

The first via layer VIA1 may include, for example, an organic material including a photosensitive material. The first via layer VIA1 may be stacked over the display region DA and the non-display region NDA and may have a roughly flat surface. After an organic material layer for a via layer is applied, the fifth contact hole CNT5, which exposes the portions of the first and second source/drain electrodes 151 and 152 of the transistor disposed in the silicon transistor region AR1, may be formed in the first via layer VIA1 by exposure and development.

Figure 15:
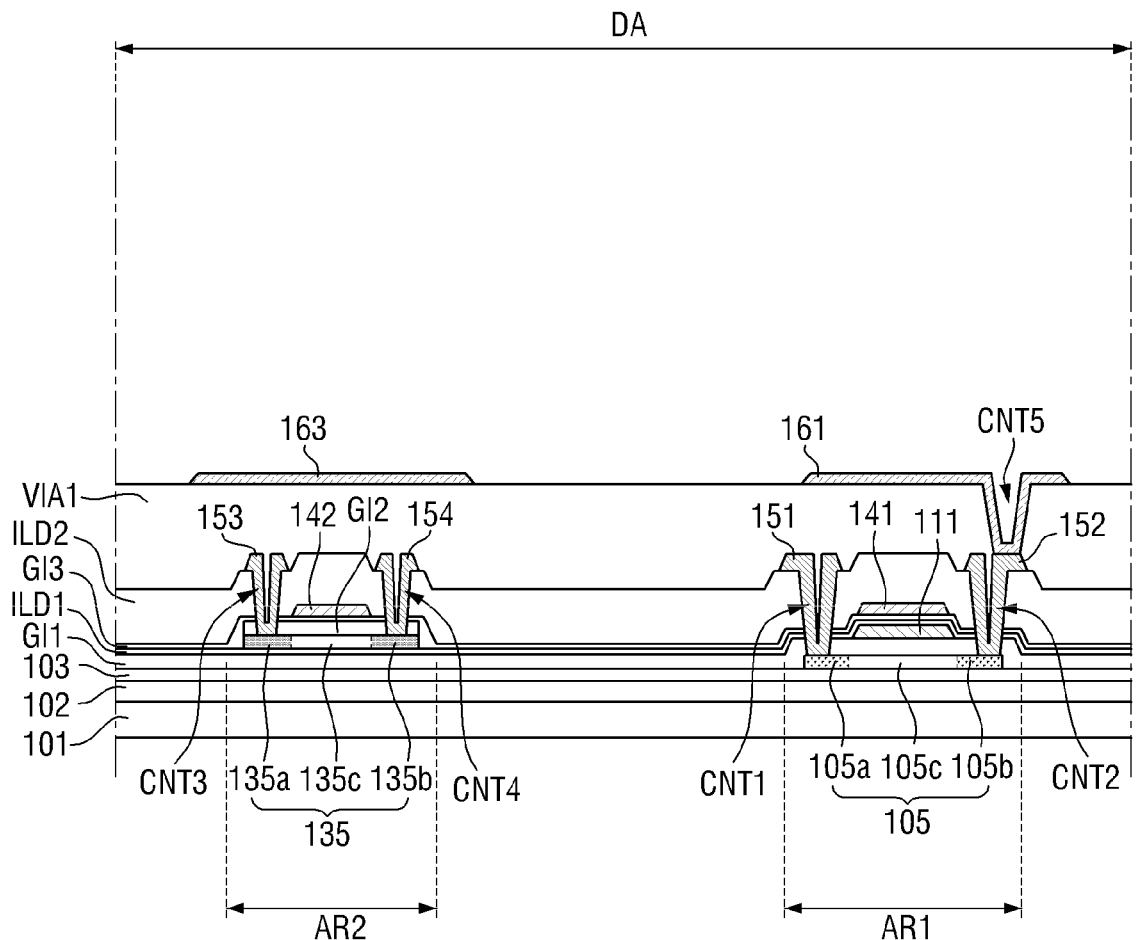

Subsequently, referring to FIG. 15, a fourth conductive layer 160 is formed on the first via layer VIA1 (S09).

Figure 20:
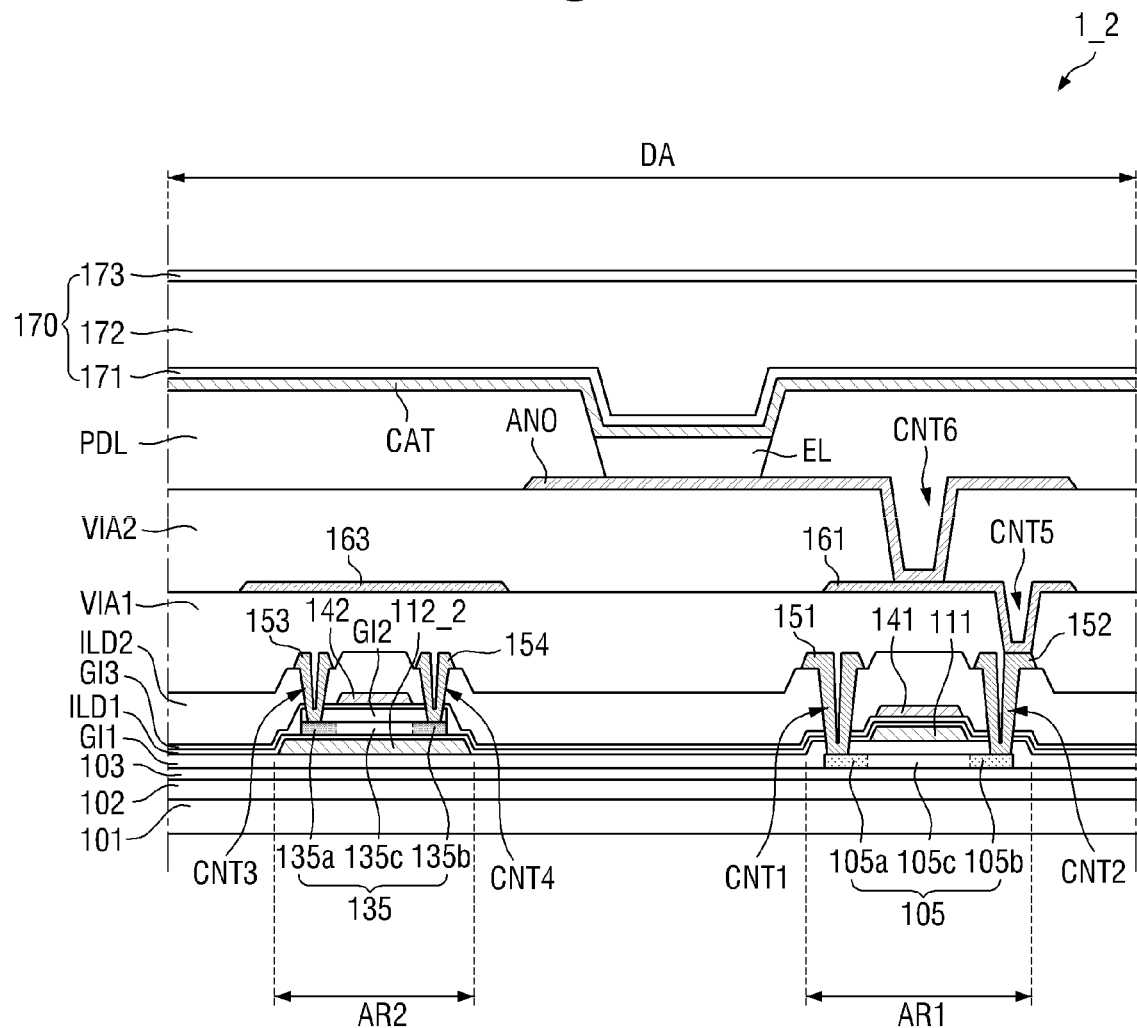
FIG. 20 is a cross-sectional view of a display device according to still another example embodiment.

The fourth conductive layer 160 may include a connection electrode 161 and an upper light blocking pattern 163, which are disposed in the display region DA. The patterned fourth conductive layer 160 may be formed by a mask process. For example, a material layer for a fourth conductive layer is deposited on an entire surface of the first via layer VIA1. In the deposition process, the material layer for the fourth conductive layer may be deposited on an inner side of the fifth contact hole CNT5. Therefore, the connection electrode 161 may be connected to the first and second source/drain electrodes 151 and 152 of the transistor disposed in the silicon transistor region AR1. Subsequently, the material layer for the fourth conductive layer is coated with a photoresist layer, a photoresist pattern is formed by exposure and development, and then the material layer for the fourth conductive layer is etched using the photoresist pattern as an etching mask. Thereafter, the photoresist pattern is removed by a stripping or ashing process and thus the patterned fourth conductive layer 160 is completely formed as illustrated in FIG. 20.

Subsequently, referring to FIG. 16, a second via layer VIA2 is formed on the fourth conductive layer 160, and a sixth contact hole CNT6 that exposes a portion of the connection electrode 161 is formed (S10).

The second via layer VIA2 may include, for example, an organic material including a photosensitive material. The second via layer VIA2 may be stacked in the display region DA and may have a roughly flat surface. After an organic material layer for a via layer is applied, the sixth contact hole CNT6, which exposes the portion of the connection electrode 161, may be formed in the second via layer VIA2 by exposure and development.

Figure 17:
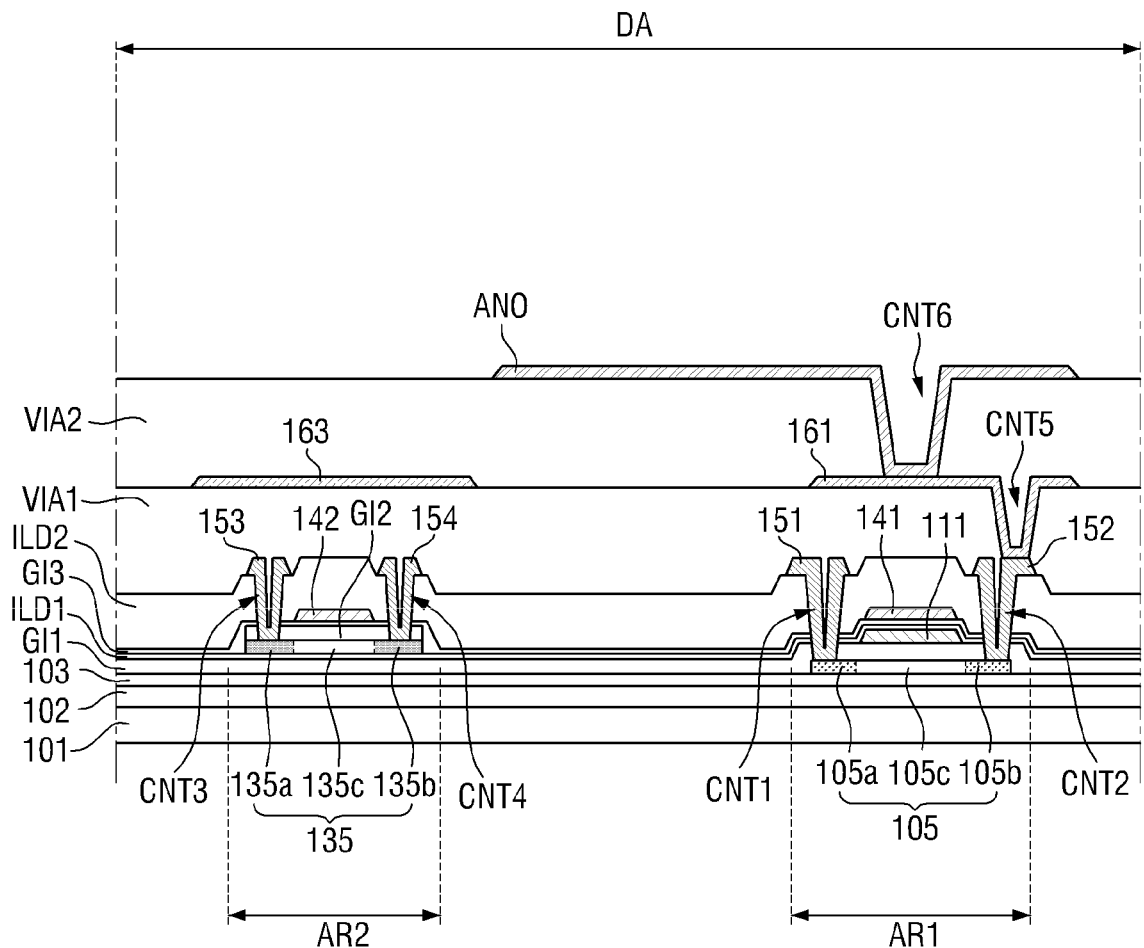

Subsequently, referring to FIG. 17, an anode electrode ANO is formed on the second via layer VIA2 (S11).

The patterned anode electrode ANO may be formed by a mask process. For example, a material layer for an anode electrode is deposited on an entire surface of the second via layer VIA2. In the deposition process, the material layer for the anode electrode may be deposited on an inner side of the sixth contact hole CNT6 and connected to the connection electrode 161.

Figure 18:
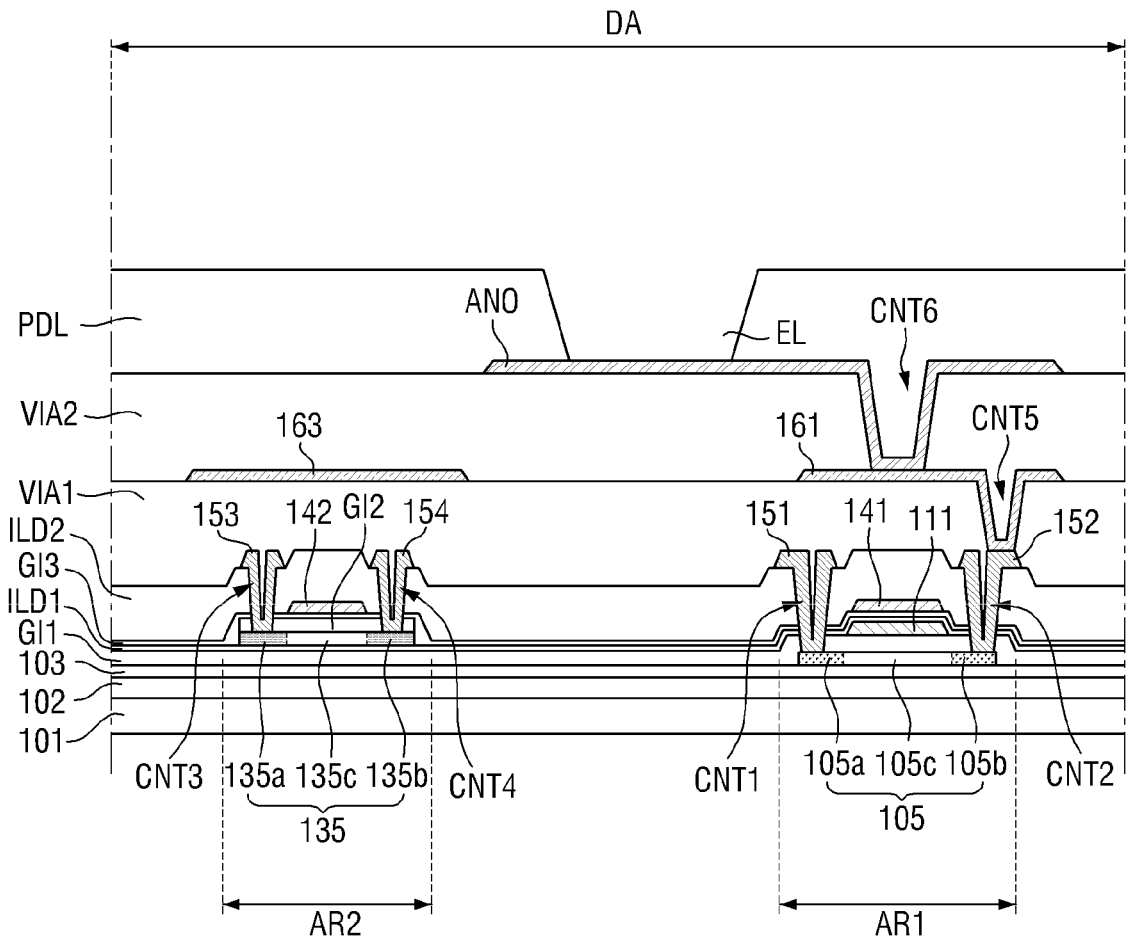

Subsequently, referring to FIG. 18, a patterned pixel definition film PDL is formed on the second via layer VIA2 in which the anode electrode ANO is formed (S12).

The pixel definition film PDL may include, for example, an organic material including a photosensitive material. In this case, the patterned pixel definition film PDL may be formed by applying an organic material layer for a pixel definition film and then performing exposure and development.

The pixel definition film PDL may be formed along a boundary of the pixel PX and may partially overlap the anode electrode ANO. The pixel definition film PDL may be formed to overlap the sixth contact hole CNT6. When an inner space of the sixth contact hole CNT6 is partially filled with the anode electrode ANO, the inner space of the sixth contact hole CNT6 may be fully filled with the pixel definition film PDL.

As described above, according to the present embodiment, the second electrode 141 of the capacitor Cst disposed in the silicon transistor region AR1 and the second gate electrode 142 of the transistor disposed in the oxide transistor region AR2 may be formed using one mask. That is, in forming the second electrode 141 of the capacitor Cst and the second gate electrode 142, two mask processes are not required to form each of the above two components and only one mask process is utilized. Therefore, the number of mask processes may be reduced, and thus process efficiency may be improved.

Hereinafter, other embodiments will be described. In the following embodiments, the same configuration as the above-described embodiment will be omitted or simplified, and differences between the following embodiments and the above-described embodiment will be mainly described.

Figure 19:
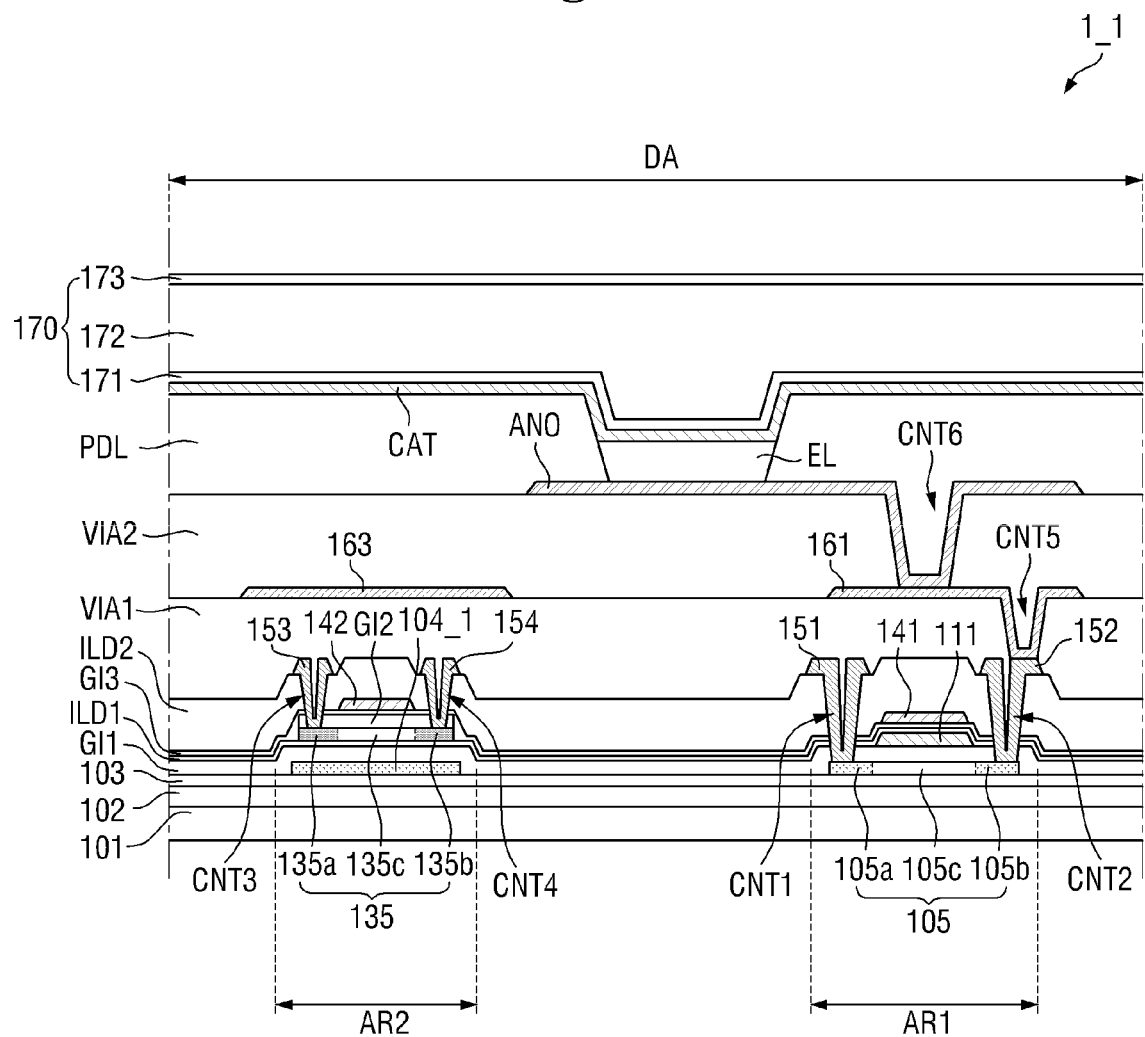
FIG. 19 is a cross-sectional view of a display device according to another example embodiment.

FIG. 19 is a cross-sectional view of a display device according to another embodiment.

Referring to FIG. 19, a display device 1_1 according to the present embodiment is different from the display device in the embodiment of FIG. 4 in that the display device 1_1 includes a silicon lower light blocking pattern 104_1.

For example, the silicon semiconductor pattern PS may further include the silicon lower light blocking pattern 104_1 as well as the silicon semiconductor layer 105. The silicon lower light blocking pattern 104 and the silicon semiconductor layer 105 may be formed of the same material and formed at the same layer. In other words, the silicon lower light blocking pattern 104 and the silicon semiconductor layer 105 may be disposed on the same layer (e.g., the buffer layer 103). The silicon lower light blocking pattern 104 may be disposed in the oxide transistor region AR2 and the silicon semiconductor layer 105 may be disposed in the silicon transistor region AR1.

The silicon lower light blocking pattern 104 may be located below the oxide semiconductor layer 135 to prevent or substantially prevent light incident from a lower direction of the display panel 100 from entering the oxide semiconductor layer 135 located above the silicon lower light blocking pattern 104. The silicon lower light blocking pattern 104 may overlap at least the channel region 135c of the oxide semiconductor layer 135.

In some embodiments, the silicon lower light blocking pattern 104 may be used as another gate electrode of the oxide transistor. In this case, the silicon lower light blocking pattern 104 may be connected to the second gate electrode 142. As another example, the silicon lower light blocking pattern 104 may be electrically connected to any one of the first source/drain electrode 153 and the second source/drain electrode 154 of the transistor disposed in the oxide transistor region AR2.

Even in the present embodiment, because an interval between the oxide semiconductor layer 135 and the second gate electrode 142 in the oxide transistor region AR2 is greater than an interval between the second electrode 141 of the capacitor Cst and the first gate electrode 111 in the silicon transistor region AR1, the uniformity of the threshold voltage of the oxide transistor may be improved and the capacitance of the capacitor Cst may be increased. In addition, because the second gate electrode 142 and the second electrode 141 of the capacitor Cst are concurrently (e.g., simultaneously) formed using the same mask, the number of mask processes may be reduced.

FIG. 20 is a cross-sectional view of a display device according to still another embodiment.

Referring to FIG. 20, a display device 1_2 according to the present embodiment is different from the display device in the embodiment of FIG. 19 in that the display device 1_2 includes a metal lower light blocking pattern 112_2 instead of a silicon lower light blocking pattern, and the metal lower light blocking pattern 112_2 is disposed on the first gate insulating film GI1 to form the first conductive layer 110.

For example, the metal lower light blocking pattern 112_2 in the present embodiment may be disposed in the oxide semiconductor transistor region AR2. Unlike the embodiment of FIG. 19, the metal lower light blocking pattern 112_2 may form the first conductive layer 110 and may be formed at the same layer as the first gate electrode 111 of the transistor disposed in the silicon transistor region AR1.

In other words, the first conductive layer 110 in the present embodiment may include the metal lower light blocking pattern 112_2 as well as the first gate electrode 111. The metal lower light blocking pattern 112_2 may be disposed on the first gate insulating film GI1 like the first gate electrode 111. Further, the metal lower light blocking pattern 112_2 may be concurrently (e.g., simultaneously) formed with the first gate electrode 111 using one mask in the operation S02 of forming the first conductive layer 110. Therefore, a separate mask for forming the metal lower light blocking pattern 112_2 is unnecessary, and thus the number of masks utilized for the process is not increased.

Even in the present embodiment, the metal lower light blocking pattern 112_2 may be used as another gate electrode of the transistor disposed in the oxide transistor region AR2. In this case, the metal lower light blocking pattern 112_2 may be opposite to the oxide semiconductor layer 135 with only the capping film ILD1 interposed therebetween, and thus the metal lower light blocking pattern 112_2 may be located to be closer to the oxide semiconductor layer 135. Therefore, the metal lower light blocking pattern 112_2 is a gate electrode, and thus may operate more smoothly.

Even in the present embodiment, because an interval between the oxide semiconductor layer 135 and the second gate electrode 142 in the oxide transistor region AR2 is greater than an interval between the second electrode 141 of the capacitor Cst and the first gate electrode 111 in the silicon transistor region AR1, the uniformity of the threshold voltage of the oxide transistor may be improved and the capacitance of the capacitor Cst may be increased. In addition, because the second gate electrode 142 and the second electrode 141 of the capacitor Cst are concurrently (e.g., simultaneously) formed using the same mask, the number of mask processes may be reduced.

Figure 21:
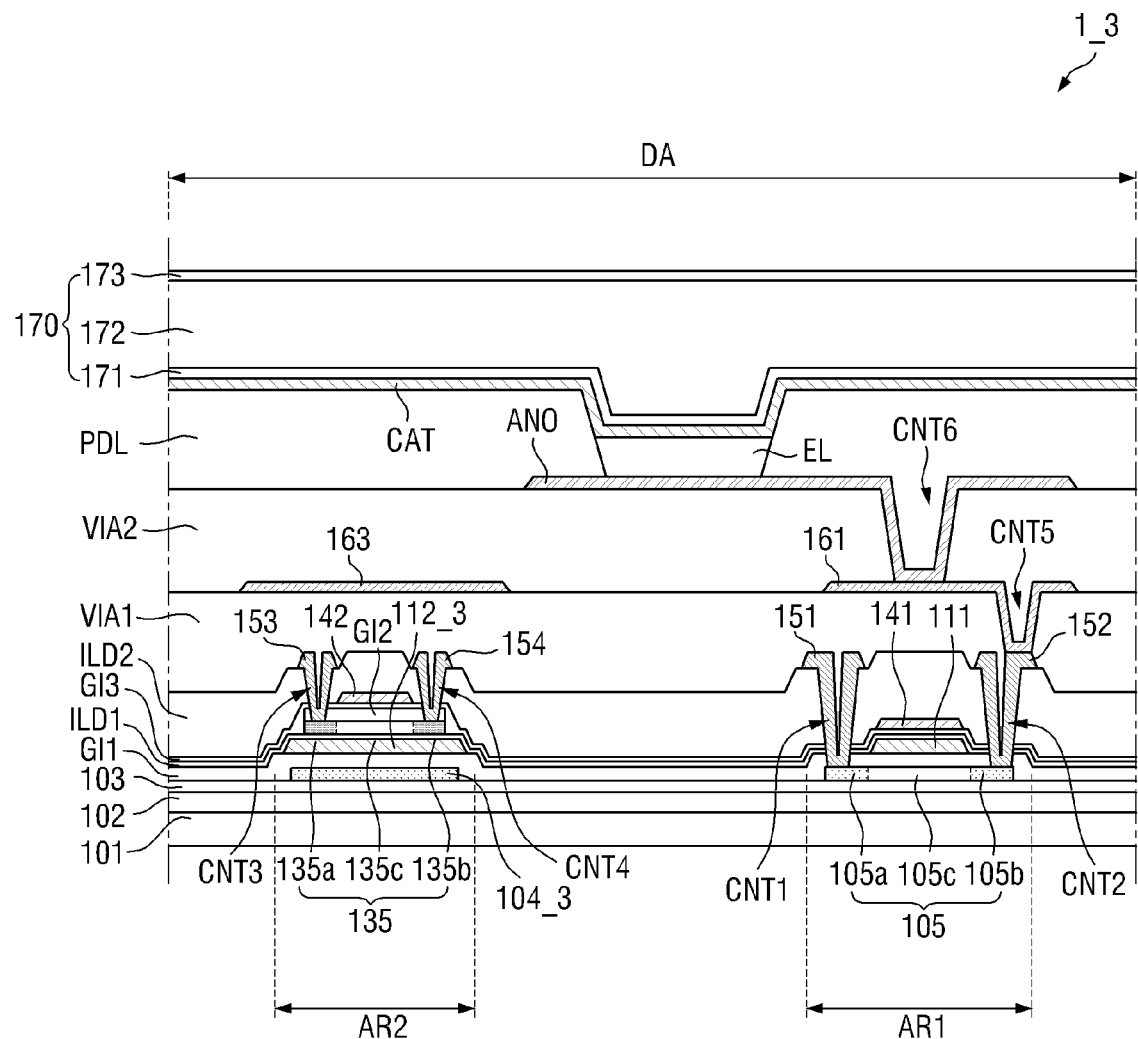
FIG. 21 is a cross-sectional view of a display device according to yet another example embodiment.

FIG. 21 is a cross-sectional view of a display device according to yet another embodiment.

Referring to FIG. 21, a display device 1_3 according to the present embodiment is different from the display device in the embodiment of FIG. 20 in that the display device 1_3 includes a silicon lower light blocking pattern 104_3 as well as a metal lower light blocking pattern 112_3.

For example, the display device 1_3 according to the present embodiment may include both of the silicon lower light blocking pattern 104_3 and the metal lower light blocking pattern 112_3 disposed in the oxide transistor region AR2. The silicon lower light blocking pattern 104_3 may be formed at the same layer as the silicon semiconductor layer 105 of the silicon semiconductor, and the metal lower light blocking pattern 112_3 may be disposed above the silicon lower light blocking pattern 104_3 while at least partially overlapping the silicon lower light blocking pattern 104_3.

Even in the present embodiment, because an interval between the oxide semiconductor layer 135 and the second gate electrode 142 in the oxide transistor region AR2 is greater than an interval between the second electrode 141 of the capacitor Cst and the first gate electrode 111 in the silicon transistor region AR1, the uniformity of the threshold voltage of the oxide transistor may be improved and the capacitance of the capacitor Cst may be increased. In addition, because the second gate electrode 142 and the second electrode 141 of the capacitor Cst are concurrently (e.g., simultaneously) formed using the same mask, the number of mask processes may be reduced.

Figure 22:
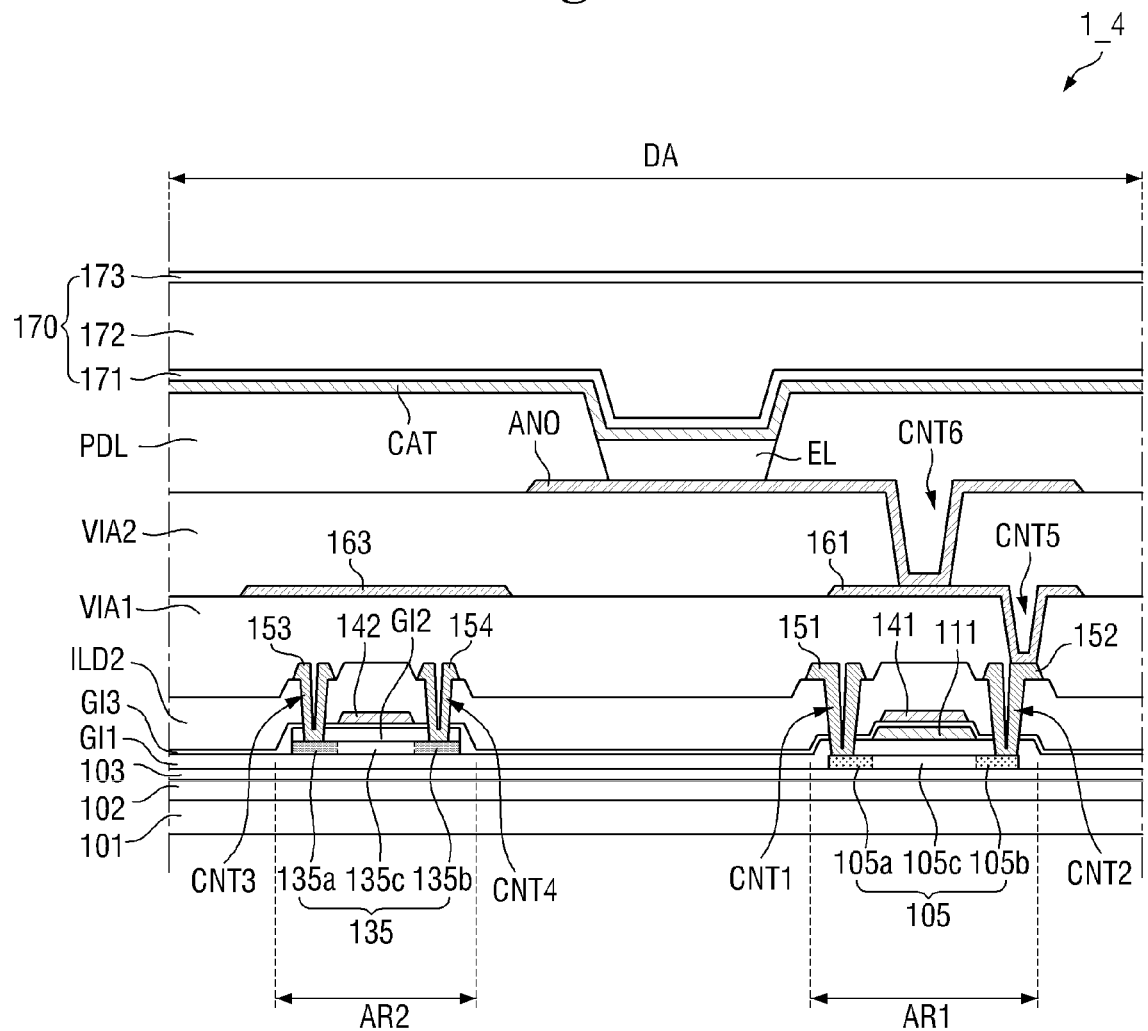
FIG. 22 is a cross-sectional view of a display device according to yet another example embodiment.

FIG. 22 is a cross-sectional view of a display device according to yet another embodiment.

Referring to FIG. 22, a display device 1_4 according to the present embodiment is different from the display device in the embodiment of FIG. 4 in that an oxide semiconductor layer 135_4 disposed in the oxide transistor region AR2 is disposed on the first gate insulating film GI1.

For example, unlike the embodiment of FIG. 4 in which the capping film ILD1 is disposed on the first gate electrode 111 disposed in the silicon transistor region AR1 and in which the oxide semiconductor layer 135 disposed in the oxide transistor region AR2 is disposed on the capping film ILD1, the oxide semiconductor layer 135_4 disposed in the oxide transistor region AR2 in the present embodiment may be disposed on the first gate insulating film GI1 and formed at the same layer as the first gate electrode 111 disposed in the silicon transistor region AR1. In other words, both of the first gate electrode 111 and the oxide semiconductor layer 135_4 may be disposed on the same insulating film (e.g., the first gate insulating film GI1).

Further, only one insulating layer (e.g., the third gate insulating film GI3) may be located between the first gate electrode 111 and the second electrode 141 of the capacitor, and thus a distance between the first electrode of the capacitor Cst connected to the first gate electrode 111 and the second electrode 141 of the capacitor Cst may be reduced. Therefore, the capacitance of the capacitor Cst, which is formed between the first electrode of the capacitor Cst connected to the first gate electrode 111 and the second electrode 141 of the capacitor, may be further increased.

Even in the present embodiment, because an interval between the oxide semiconductor layer 135 and the second gate electrode 142 in the oxide transistor region AR2 is greater than an interval between the second electrode 141 of the capacitor Cst and the first gate electrode 111 in the silicon transistor region AR1, the uniformity of the threshold voltage of the oxide transistor may be improved and the capacitance of the capacitor Cst may be further increased. In addition, because the second gate electrode 142 and the second electrode 141 of the capacitor Cst are concurrently (e.g., simultaneously) formed using the same mask, the number of mask processes may be reduced.

Figure 23:
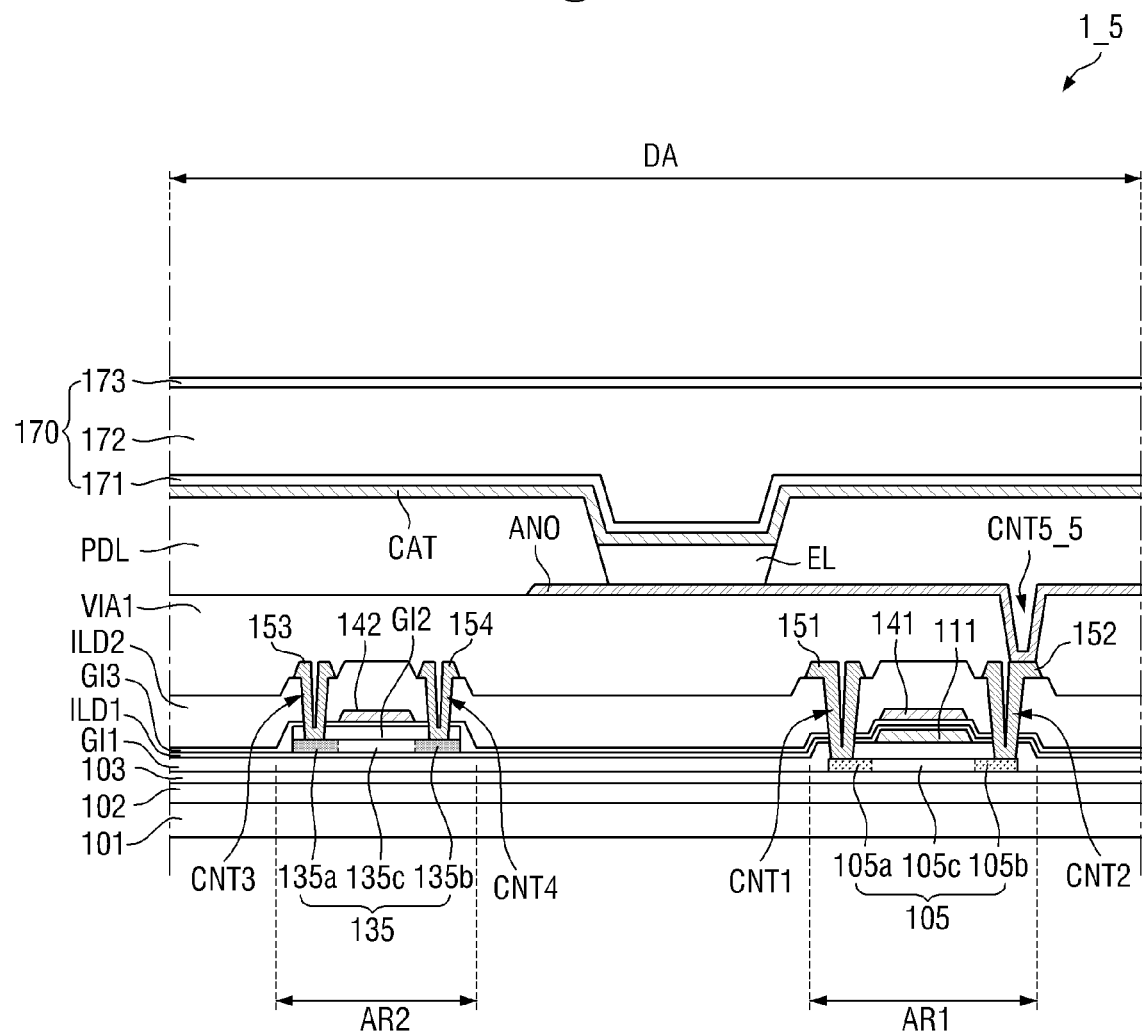
FIG. 23 is a cross-sectional view of a display device according to yet another example embodiment.
Figure 24:
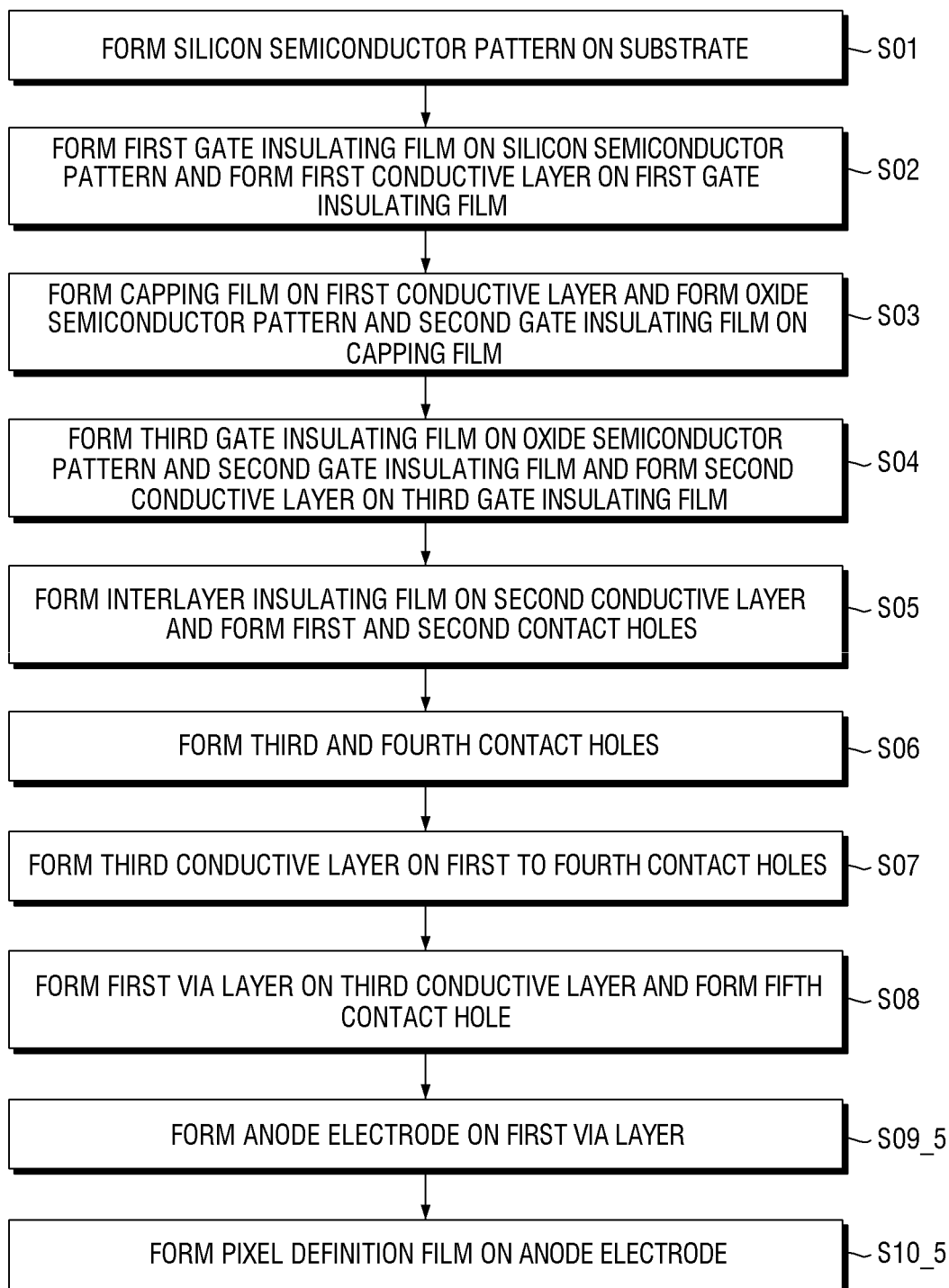
FIG. 24 is a flowchart illustrating a method of manufacturing the display device according to the embodiment of FIG. 23.

FIG. 23 is a cross-sectional view of a display device according to yet another embodiment. FIG. 24 is a flowchart illustrating a method of manufacturing the display device according to the embodiment of FIG. 23.

Referring to FIGS. 23 and 24, a display device 1_5 according to the present embodiment is different from the display device in the embodiment of FIG. 4 in that the anode electrode ANO is directly connected to the third conductive layer 150.

For example, the first via layer VIA1 is formed on the third conductive layer 150, and a fifth contact hole CNT5_5, which exposes a portion of the third conductive layer 150, is formed on the first via layer VIA1 (S08). Thereafter, the anode electrode ANO is formed on the first via layer VIA1 (S09_5). The anode electrode ANO may be stacked in the fifth contact hole CNT5_5, and the anode electrode ANO may be connected to the third conductive layer 150 through the fifth contact hole CNT5_5. Thereafter, the pixel definition film PDL may be formed on the anode electrode ANO (S10_5).

Even in the present embodiment, because an interval between the oxide semiconductor layer 135 and the second gate electrode 142 in the oxide transistor region AR2 is greater than an interval between the second electrode 141 of the capacitor Cst and the first gate electrode 111 in the silicon transistor region AR1, the uniformity of the threshold voltage of the oxide transistor may be improved and the capacitance of the capacitor Cst may be increased. In addition, because the second gate electrode 142 and the second electrode 141 of the capacitor Cst are concurrently (e.g., simultaneously) formed using the same mask, the number of mask processes may be reduced.

It should be understood that embodiments described herein should be considered in a descriptive sense and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and equivalents thereof.

What is claimed is:

1. A method of manufacturing a display device comprising:
    forming a first semiconductor pattern on a substrate;
    forming a first gate insulating film covering the first semiconductor pattern;
    forming a first conductive layer on the first gate insulating film;
    forming a material layer for a second semiconductor layer on the first gate insulating film;
    forming a material layer for a second gate insulating film on the material layer for the second semiconductor layer;
    sequentially etching the material layer for the second gate insulating film and the material layer for the second semiconductor layer using a same etching mask and forming a second semiconductor pattern and the second gate insulating film on the second semiconductor pattern;
    forming a third gate insulating film covering the second gate insulating film; and
    forming a second conductive layer on the third gate insulating film,
    wherein the first semiconductor pattern comprises a semiconductor layer of a first transistor,
    wherein the second semiconductor pattern comprises a semiconductor layer of a second transistor, and a side surface of the second semiconductor pattern is aligned with a side surface of the second gate insulating film,
    wherein the first conductive layer comprises a gate electrode of the first transistor and a first electrode of a capacitor, and
    wherein the second conductive layer comprises a gate electrode of the second transistor and a second electrode of the capacitor,
    wherein the third gate insulating film is between the first and second electrodes of the capacitor.

2. The method of claim 1, wherein the second gate insulating film comprises silicon oxide, and the third gate insulating film comprises silicon nitride.

3. The method of claim 1, wherein the second gate insulating film is between the second semiconductor pattern and the gate electrode of the second transistor, and is not between the first electrode of the capacitor and the second electrode of the capacitor.

4. The method of claim 1, further comprising forming a capping film covering the first conductive layer,
    wherein the capping film is interposed between the first gate insulating film and the second semiconductor pattern and between the gate electrode of the first transistor and the third gate insulating film.

* * * * *